(12) United States Patent
Sakaniwa et al.

(10) Patent No.: US 11,881,267 B2
(45) Date of Patent: Jan. 23, 2024

(54) SEMICONDUCTOR MEMORY DEVICE

(71) Applicant: KIOXIA CORPORATION, Tokyo (JP)

(72) Inventors: Manabu Sakaniwa, Fujisawa (JP); Yasuhiro Shiino, Fujisawa (JP); Kota Nishikawa, Sagamihara (JP); Yu Ishiyama, Kawasaki (JP); Shinji Suzuki, Sagamihara (JP)

(73) Assignee: KIOXIA CORPORATION, Tokyo (JP)

( * ) Notice: Subject to any disclaimer, the term of this patent is extended or adjusted under 35 U.S.C. 154(b) by 50 days.

(21) Appl. No.: 17/654,136

(22) Filed: Mar. 9, 2022

(65) Prior Publication Data

US 2023/0056364 A1    Feb. 23, 2023

(30) Foreign Application Priority Data

Aug. 18, 2021 (JP) ................................ 2021-133715

(51) Int. Cl.
| | | |
|---|---|---|
| *G11C 11/34* | (2006.01) | |
| *G11C 16/16* | (2006.01) | |
| *G11C 16/04* | (2006.01) | |
| *H10B 41/27* | (2023.01) | |
| *H10B 43/27* | (2023.01) | |

(52) U.S. Cl.
CPC .......... *G11C 16/16* (2013.01); *G11C 16/0483* (2013.01); *H10B 41/27* (2023.02); *H10B 43/27* (2023.02)

(58) Field of Classification Search
CPC ..... G11C 16/16; G11C 16/14; G11C 16/3445; G11C 16/344; H01L 27/115
USPC ........................................ 365/185.05, 185.29
See application file for complete search history.

(56) References Cited

U.S. PATENT DOCUMENTS

| | | |
|---|---|---|
| 9,343,171 B1 | 5/2016 | Sun et al. |
| 9,355,731 B2 | 5/2016 | Shiga et al. |
| 10,497,446 B2 | 12/2019 | Takizawa et al. |

(Continued)

FOREIGN PATENT DOCUMENTS

| | | |
|---|---|---|
| JP | 2016-51485 A | 4/2016 |
| JP | 2018-170057 A | 11/2018 |
| JP | 6581019 B2 | 9/2019 |

*Primary Examiner* — Son T Dinh
(74) *Attorney, Agent, or Firm* — Oblon, McClelland, Maier & Neustadt, L.L.P.

(57) ABSTRACT

A semiconductor memory device includes a substrate, gate electrodes, a semiconductor layer opposed to gate electrodes, an electric charge accumulating layer disposed between gate electrodes and the semiconductor layer, a conductive layer connected to one end portion of the semiconductor layer, and a control circuit electrically connected to gate electrodes and the conductive layer. Gate electrodes include first gate electrodes, second gate electrodes, and third gate electrode. The control circuit is configured to perform an erase operation. The erase operation includes: at least one-time first operation that applies a first voltage to the conductive layer; a second operation performed after the first operation, the second operation applying a second voltage to the third gate electrode; and at least one-time third operation performed after the second operation, the third operation applying a third voltage same as or larger than the first voltage to the conductive layer.

19 Claims, 26 Drawing Sheets

(56) References Cited

U.S. PATENT DOCUMENTS

| | | |
|---|---|---|
| 11,176,998 B2 | 11/2021 | Maejima |
| 2018/0261618 A1* | 9/2018 | Lee .................. H01L 23/53295 |
| 2018/0331116 A1* | 11/2018 | Tezuka ................ H01L 29/4234 |

* cited by examiner

DMC

SEMICONDUCTOR MEMORY DEVICE

CROSS-REFERENCE TO RELATED APPLICATIONS

This application is based upon and claims the benefit of Japanese Patent Application No. 2021-133715, filed on Aug. 18, 2021, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of gate electrodes arranged in a first direction intersecting with a surface of the substrate, and a semiconductor layer extending in the first direction and opposed to the plurality of gate electrodes.

DETAILED DESCRIPTION

Figure 1:
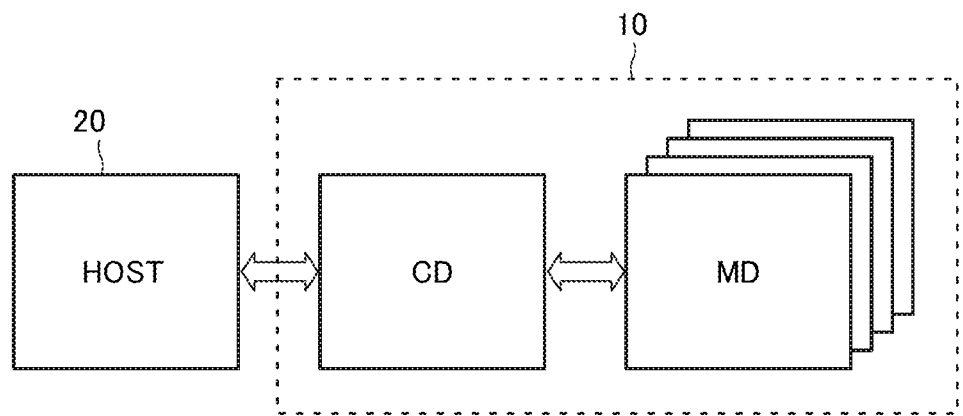
FIG. 1 is a schematic block diagram illustrating a configuration of a memory system 10 according to a first embodiment.

A semiconductor memory device according to one embodiment comprises a substrate, a plurality of gate electrodes, a semiconductor layer, an electric charge accumulating layer, a conductive layer, and a control circuit. The plurality of gate electrodes are arranged in a first direction intersecting with a surface of the substrate. The semiconductor layer extends in the first direction and is opposed to the plurality of gate electrodes. The electric charge accumulating layer is disposed between the plurality of gate electrodes and the semiconductor layer. The conductive layer is connected to one end portion in the first direction of the semiconductor layer. The control circuit is electrically connected to the plurality of gate electrodes and the conductive layer. The plurality of gate electrodes include a plurality of first gate electrodes, a plurality of second gate electrodes farther from the conductive layer than the plurality of first gate electrodes, and a third gate electrode disposed between the plurality of first gate electrodes and the plurality of second gate electrodes. The control circuit is configured to be able to perform an erase operation. The erase operation includes: at least one-time first operation that applies a first voltage to the conductive layer; a second operation performed after the at least one-time first operation, the second operation applying a second voltage to the third gate electrode; and at least one-time third operation performed after the second operation, the at least one-time third operation applying a third voltage same as or larger than the first voltage to the conductive layer.

Next, the semiconductor memory devices according to embodiments will be described in detail with reference to the drawings. The following embodiments are only examples, and not described for the purpose of limiting the present invention.

In this specification, when referring to a "semiconductor memory device", it may mean a memory die (a memory chip) and may mean a memory system including a controller die, such as a memory card and an SSD. Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Memory System 10]

FIG. 1 is a schematic block diagram illustrating a configuration of the memory system 10 according to the first embodiment.

The memory system 10, for example, reads, writes, and erases user data according to a signal transmitted from a host computer 20. The memory system 10 is, for example, any system that can store the user data including a memory card and an SSD. The memory system 10 includes a plurality of memory dies MD that store the user data and a controller die CD connected to these plurality of memory dies MD and host computer 20. The controller die CD includes, for example, a processor, a RAM, and the like, and performs processing, such as conversion between a logical address and a physical address, bit error detection/correction, a garbage collection (compaction), and a wear leveling.

Figure 2:
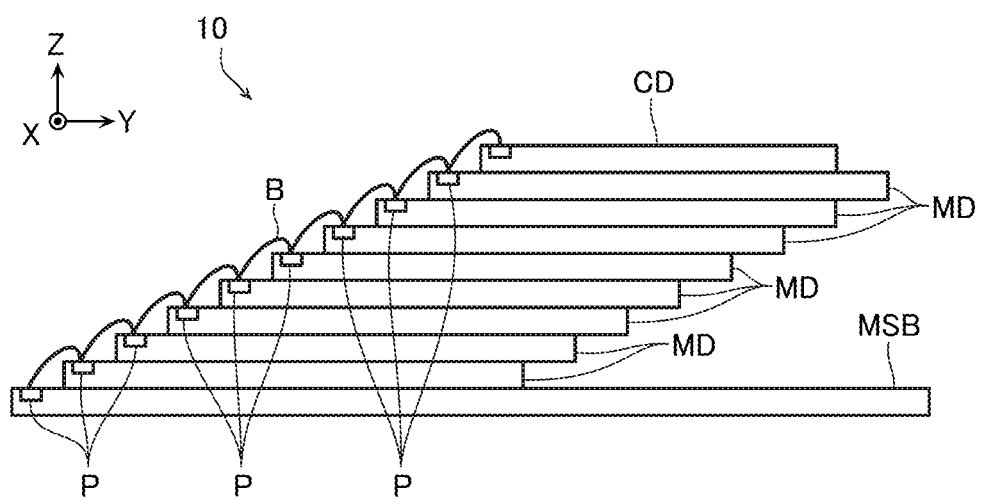
FIG. 2 is a schematic side view illustrating a configuration example of the memory system 10.
Figure 3:
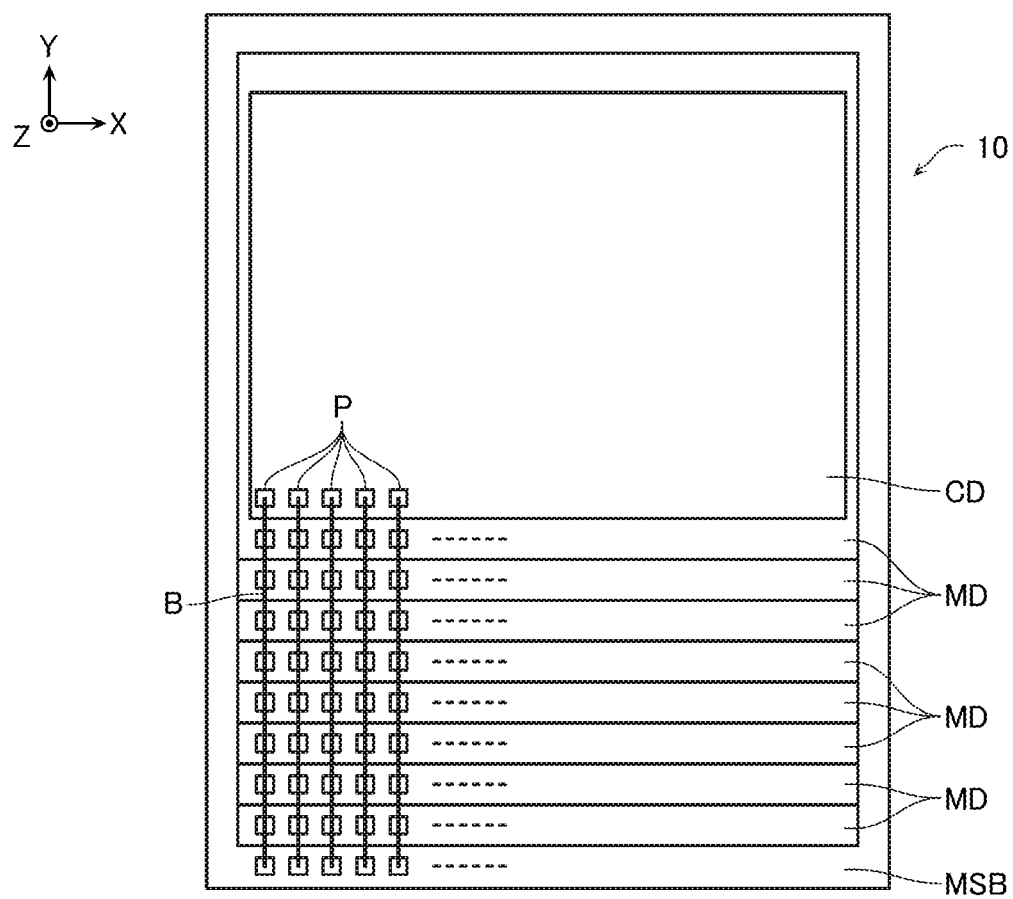
FIG. 3 is a schematic plan view illustrating a configuration example of the memory system 10.

FIG. 2 is a schematic side view illustrating a configuration example of the memory system 10 according to the embodiment. FIG. 3 is a schematic plan view illustrating the configuration example. For sake of convenience of explanation, FIG. 2 and FIG. 3 omit a part of a configuration.

As illustrated in FIG. 2, the memory system 10 according to the embodiment includes a mounting substrate MSB, the plurality of memory dies MD stacked on the mounting substrate MSB, and the controller die CD stacked on the memory die MD. On an upper surface of the mounting substrate MSB, pad electrodes P are disposed in a region at an end portion in the Y-direction, and a part of the other region is bonded to a lower surface of the memory die MD via an adhesive and the like. On an upper surface of the memory die MD, the pad electrodes P are disposed in a region at an end portion in the Y-direction, and the other region is bonded to a lower surface of another memory die MD or the controller die CD via the adhesive and the like. On an upper surface of the controller die CD, the pad electrodes P are disposed in a region at an end portion in the Y-direction.

As illustrated in FIG. 3, the mounting substrate MSB, the plurality of memory dies MD, and the controller die CD each include a plurality of the pad electrodes P arranged in the X-direction. The plurality of pad electrodes P disposed on each of the mounting substrate MSB, the plurality of memory dies MD, and the controller die CD are mutually connected via bonding wires B.

Note that the configuration illustrated in FIG. 2 and FIG. 3 is merely an example, and specific configurations are appropriately adjustable. For example, in the example illustrated in FIG. 2 and FIG. 3, the controller die CD is stacked on the plurality of memory dies MD, and these configurations are connected with the bonding wires B. In such a configuration, the plurality of memory dies MD and the controller die CD are included in one package. However, the controller die CD may be included in a package different from the memory die MD. Additionally, the plurality of memory dies MD and the controller die CD may be connected to one another via through electrodes or the like, not the bonding wires B.

[Circuit Configuration of Memory Die MD]

Figure 4:
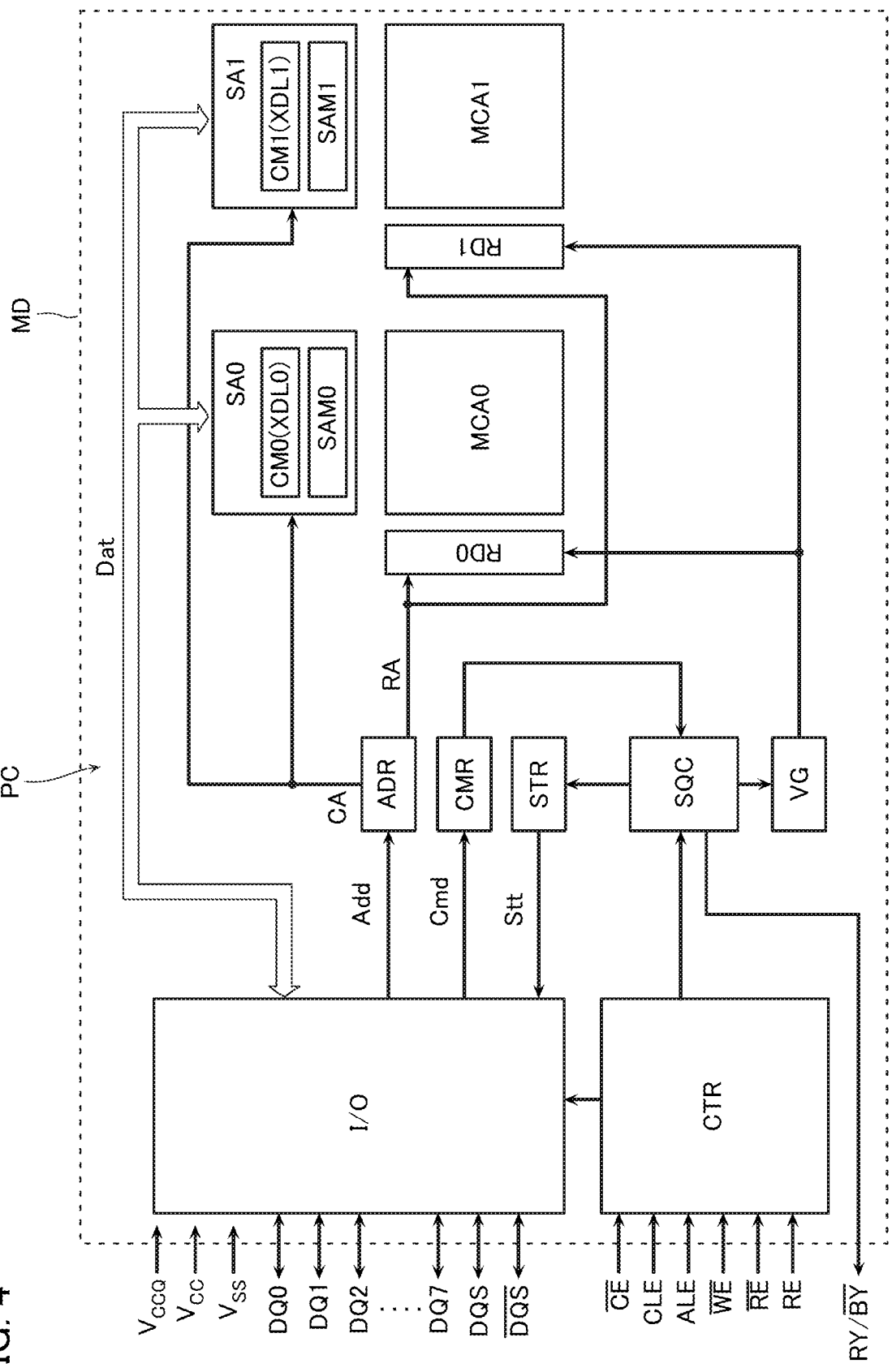
FIG. 4 is a schematic block diagram illustrating a configuration of a memory die MD.
Figure 5:
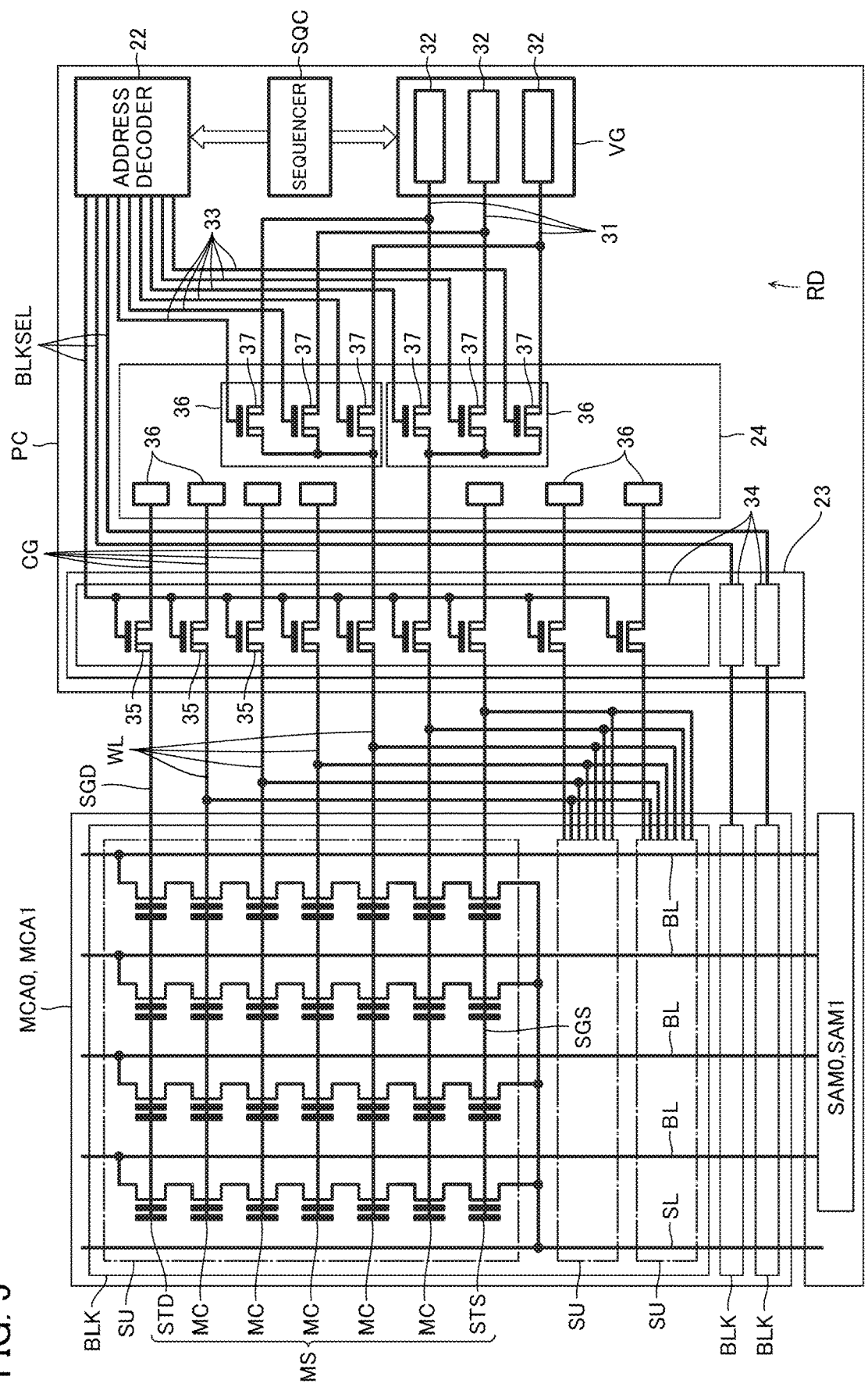
FIG. 5 is a schematic circuit diagram illustrating a configuration of a part of the memory die MD.

FIG. 4 is a schematic block diagram illustrating a configuration of the memory die MD according to the first embodiment. FIG. 5 is a schematic circuit diagram illustrating a configuration of a part of the memory die MD. For sake of convenience of explanation, FIG. 4 and FIG. 5 omit a part of a configuration.

FIG. 4 illustrates a plurality of control terminals and the like. These plurality of control terminals are represented as control terminals corresponding to a high active signal (a positive logic signal) in some cases, represented as control terminals corresponding to a low active signal (a negative logic signal) in some cases, and represented as control terminals corresponding to both the high active signal and the low active signal in some cases. In FIG. 4, a reference sign of the control terminal corresponding to the low active signal includes an over line (overbar). In this specification, a reference sign of the control terminal corresponding to the low active signal includes a slash (IT/IT). The description of FIG. 4 is an example, and specific aspects are appropriately adjustable. For example, a part of or all of the high active signals can be changed to the low active signals, or a part of or all of the low active signals can be changed to the high active signals. Additionally, a terminal RY/(/BY) described later is a terminal that outputs a ready signal as the high active signal and a busy signal as the low active signal. The slash ("/") between RY and (/BY) indicates a break between the ready signal and the busy signal.

As illustrated in FIG. 4, the memory die MD includes memory cell arrays MCA0, MCA1 storing the user data and a peripheral circuit PC connected to the memory cell arrays MCA0, MCA1. In the following description, the memory cell arrays MCA0, MCA1 are referred to as memory cell arrays MCA in some cases.

[Circuit Configuration of Memory Cell Array MCA]

As illustrated in FIG. 5, the memory cell array MCA includes a plurality of memory blocks BLK. Each of these plurality of memory blocks BLK includes a plurality of string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL.

The memory string MS includes a drain-side select transistor STD, a plurality of memory cells MC (memory cell transistors), and a source-side select transistor STS, which are connected in series between the bit line BL and the source line SL. Hereinafter, the drain-side select transistor STD and the source-side select transistor STS are simply referred to as select transistors (STD, STS) in some cases.

The memory cell MC is a field-effect type transistor that includes a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC usually stores the user data of one bit or a plurality of bits. Respective word lines WL are connected to the gate electrodes of the plurality of memory cells MC corresponding to one memory string MS. Each of these word lines WL is connected to all the memory strings MS in one memory block BLK in common.

The select transistors (STD, STS) are field-effect type transistors that include a semiconductor layer, a gate insulating film, and a gate electrode. The semiconductor layer functions as a channel region. A drain-side select gate line SGD and a source-side select gate line SGS are connected to gate electrodes of the select transistors (STD, STS), respectively. The drain-side select gate line SGD is disposed corresponding to the string unit SU and is connected in common to all the memory strings MS in one string unit SU. The source-side select gate line SGS is connected in common to all the memory strings MS in the memory block BLK. Hereinafter, the drain-side select gate line SGD and the source-side select gate line SGS will be simply referred to as select gate lines (SGD, SGS).

[Circuit Configuration of Peripheral Circuit PC]

For example, as illustrated in FIG. 4, the peripheral circuit PC includes row decoders RD0, RD1 and sense amplifiers SA0, SA1 connected to the memory cell arrays MCA0, MCA1, respectively. The peripheral circuit PC includes a voltage generation circuit VG and a sequencer SQC. The peripheral circuit PC includes an input/output control circuit I/O, a logic circuit CTR, an address register ADR, a command register CMR, and a status register STR. In the following description, the row decoders RD0, RD1 are referred to as row decoders RD and the sense amplifiers SA0, SA1 are referred to as sense amplifiers SA in some cases.

[Configuration of Row Decoder RD]

For example, as illustrated in FIG. 5, the row decoder RD (FIG. 4) includes an address decoder 22 that decodes address data Add (FIG. 4). The row decoder RD (FIG. 4) includes a block select circuit 23 and a voltage select circuit 24 that transfer an operating voltage to the memory cell array MCA according to an output signal from the address decoder 22.

The address decoder 22 is connected to a plurality of block select lines BLKSEL and a plurality of voltage select lines 33. For example, the address decoder 22 sequentially refers to a row address RA in the address register ADR (FIG. 4) in response to a control signal from the sequencer SQC.

The block select circuit 23 includes a plurality of block select circuits 34 corresponding to the memory blocks BLK.

The block select circuits 34 each include a plurality of block select transistors 35 corresponding to the word lines WL and the select gate lines (SGD, SGS).

The block select transistor 35 is, for example, a field-effect type high breakdown voltage transistor. The block select transistors 35 have drain electrodes each electrically connected to the corresponding word line WL or the select gate line (SGD, SGS). The source electrodes of the block select transistors 35 are each electrically connected to a voltage supply line 31 via a wiring CG and the voltage select circuit 24. The gate electrodes of the block select transistors 35 are commonly connected to the corresponding block select line BLKSEL.

The voltage select circuit 24 includes a plurality of voltage selectors 36 corresponding to the word lines WL and the select gate lines (SGD, SGS). Each of these plurality of voltage selectors 36 includes a plurality of voltage select transistors 37. The voltage select transistor 37 is, for example, a field-effect type high breakdown voltage transistor. The voltage select transistors 37 have drain terminals each electrically connected to the corresponding word line WL or the select gate line (SGD, SGS) via the wiring CG and the block select circuit 23. Each of the source terminals is electrically connected to the corresponding voltage supply line 31. Each of the gate electrodes is connected to the corresponding voltage select line 33.

[Configuration of Sense Amplifier SA]

The sense amplifiers SA0, SA1 (FIG. 4) include sense amplifier modules SAM0, SAM1 and cache memories CM0, CM1 (data registers), respectively. The cache memories CM0, CM1 include latch circuits XDL0, XDL1, respectively.

In the following description, the sense amplifier module SAM0, SAM1 is referred to as a sense amplifier module SAM, the cache memory CM0, CM1 is referred to as a cache memory CM, and the latch circuit XDL0, XDL1 is referred to as a latch circuit XDL in some cases.

The plurality of latch circuits XDL are each connected to a latch circuit in the sense amplifier module SAM. For example, the latch circuit XDL stores the user data written to the memory cell MC or the user data read from the memory cell MC.

For example, a column decoder is connected to the cache memory CM. The column decoder decodes a column address CA stored in the address register ADR (FIG. 4) and selects the latch circuit XDL corresponding to the column address CA.

At a write operation, user data Dat included in the plurality of latch circuits XDL are sequentially transferred to the latch circuits in the sense amplifier modules SAM. At a read operation, the user data Dat included in the latch circuits in the sense amplifier modules SAM are sequentially transferred to the latch circuits XDL. At a data-out operation, the user data Dat included in the latch circuits XDL are sequentially transferred to the input/output control circuit I/O.

[Configuration of Voltage Generation Circuit VG]

For example, as illustrated in FIG. 5, the voltage generation circuit VG (FIG. 4) is connected to a plurality of the voltage supply lines 31. The voltage generation circuit VG includes, for example, a step down circuit, such as a regulator, and a step up circuit, such as a charge pump circuit 32. These step down circuit and step up circuit are each connected to the voltage supply line to which a power supply voltage $V_{cc}$ and a ground voltage $V_{ss}$ (FIG. 4) are applied. These voltage supply lines are connected to, for example, the pad electrodes P described with reference to FIG. 2 and FIG. 3. For example, the voltage generation circuit VG generates a plurality of operating voltages applied to the bit line BL, the source line SL, the word line WL, and the select gate lines (SGD, SGS) in the read operation, the write operation, and the erase operation on the memory cell array MCA in response to the control signal from the sequencer SQC to simultaneously output the operating voltages to the plurality of voltage supply lines 31. The operating voltage output from the voltage supply line 31 is appropriately adjusted in response to the control signal from the sequencer SQC.

[Configuration of Sequencer SQC]

In accordance with command data Cmd stored in the command register CMR, the sequencer SQC (FIG. 4) outputs an internal control signal to the row decoders RD0, RD1, the sense amplifier modules SAM0, SAM1, and the voltage generation circuit VG. The sequencer SQC appropriately outputs status data Stt indicative of the state of the memory die MD to the status register STR.

The sequencer SQC generates a ready/busy signal and outputs it to the terminal RY/(/BY). In a time period while the terminal RY/(/BY) is in a "L" state (a busy period), access to the memory die MD is basically inhibited. In a time period while the terminal RY/(/BY) is in a "H" state (a ready period), access to the memory die MD is permitted. Note that, for example, the terminal RY/(/BY) is achieved by the pad electrode P described with reference to FIG. 2 and FIG. 3.

[Configuration of Address Register ADR]

As illustrated in FIG. 4, the address register ADR is connected to the input/output control circuit I/O and stores the address data Add input from the input/output control circuit I/O. For example, the address register ADR includes a plurality of eight-bit register strings. For example, when an internal operation, such as the read operation, the write operation, or the erase operation is performed, the register string latches the address data Add corresponding to the internal operation in execution.

The address data Add, for example, includes the column address CA (FIG. 4) and the row address RA (FIG. 4). For example, the row address RA includes a block address to identify the memory block BLK (FIG. 5), a page address to identify the string unit SU and the word line WL, a plane address to identify the memory cell array MCA (plane), and a chip address to identify the memory die MD.

[Configuration of Command Register CMR]

The command register CMR is connected to the input/output control circuit I/O and stores the command data Cmd input from the input/output control circuit I/O. For example, the command register CMR includes at least one set of an eight-bit register string. When the command data Cmd is stored in the command register CMR, the control signal is transmitted to the sequencer SQC.

[Configuration of Status Register STR]

The status register STR is connected to the input/output control circuit I/O and stores the status data Stt output to the input/output control circuit I/O. For example, the status register STR includes a plurality of eight-bit register strings. For example, when the internal operation, such as the read operation, the write operation, or the erase operation is performed, the register string latches the status data Stt regarding the internal operation in execution. The register string, for example, latches ready/busy information of the memory cell arrays MCA0, MCA1.

[Configuration of Input/Output Control Circuit I/O]

The input/output control circuit I/O (FIG. 4) includes data signal input/output terminals DQ0 to DQ7, data strobe signal input/output terminals DQS, /DQS, a shift register, and a buffer circuit.

Each of the data signal input/output terminals DQ0 to DQ7 and the data strobe signal input/output terminals DQS, /DQS is achieved by, for example, the pad electrodes P described with reference to FIG. 2 and FIG. 3. The data input via the data signal input/output terminals DQ0 to DQ7 is input to the cache memory CM, the address register ADR, or the command register CMR from the buffer circuit in response to the internal control signal from the logic circuit CTR. The data output via the data signal input/output terminals DQ0 to DQ7 is input to the buffer circuit from the cache memory CM or the status register STR in response to the internal control signal from the logic circuit CTR.

The signals input via the data strobe signal input/output terminals DQS, /DQS (for example, a data strobe signal and its complementary signal) are used at data input via the data signal input/output terminals DQ0 to DQ7. The data input via the data signal input/output terminals DQ0 to DQ7 are taken in the shift register in the input/output control circuit I/O at a timing of a voltage rise edge (switching of the input signal) of the data strobe signal input/output terminal DQS and a voltage fall edge (switching of the input signal) of the data strobe signal input/output terminal/DQS, and at a timing of a voltage fall edge (switching of the input signal) of the data strobe signal input/output terminal DQS and a voltage rise edge (switching of the input signal) of the data strobe signal input/output terminal/DQS.

[Configuration of Logic Circuit CTR]

The logic circuit CTR (FIG. 4) includes a plurality of external control terminals/CE, CLE, ALE, /WE, /RE, RE and a logic circuit connected to the plurality of external control terminals/CE, CLE, ALE, /WE, /RE, RE. The logic circuit CTR receives an external control signal from the controller die CD via the external control terminals/CE, CLE, ALE, /WE, /RE, RE and outputs the internal control signal to the input/output control circuit I/O in response to this.

Note that, for example, each of the external control terminals/CE, CLE, ALE, /WE, /RE, RE is achieved by the pad electrode P described with reference to FIG. 2 and FIG. 3.

[Structure of Memory Die MD]

Figure 6:
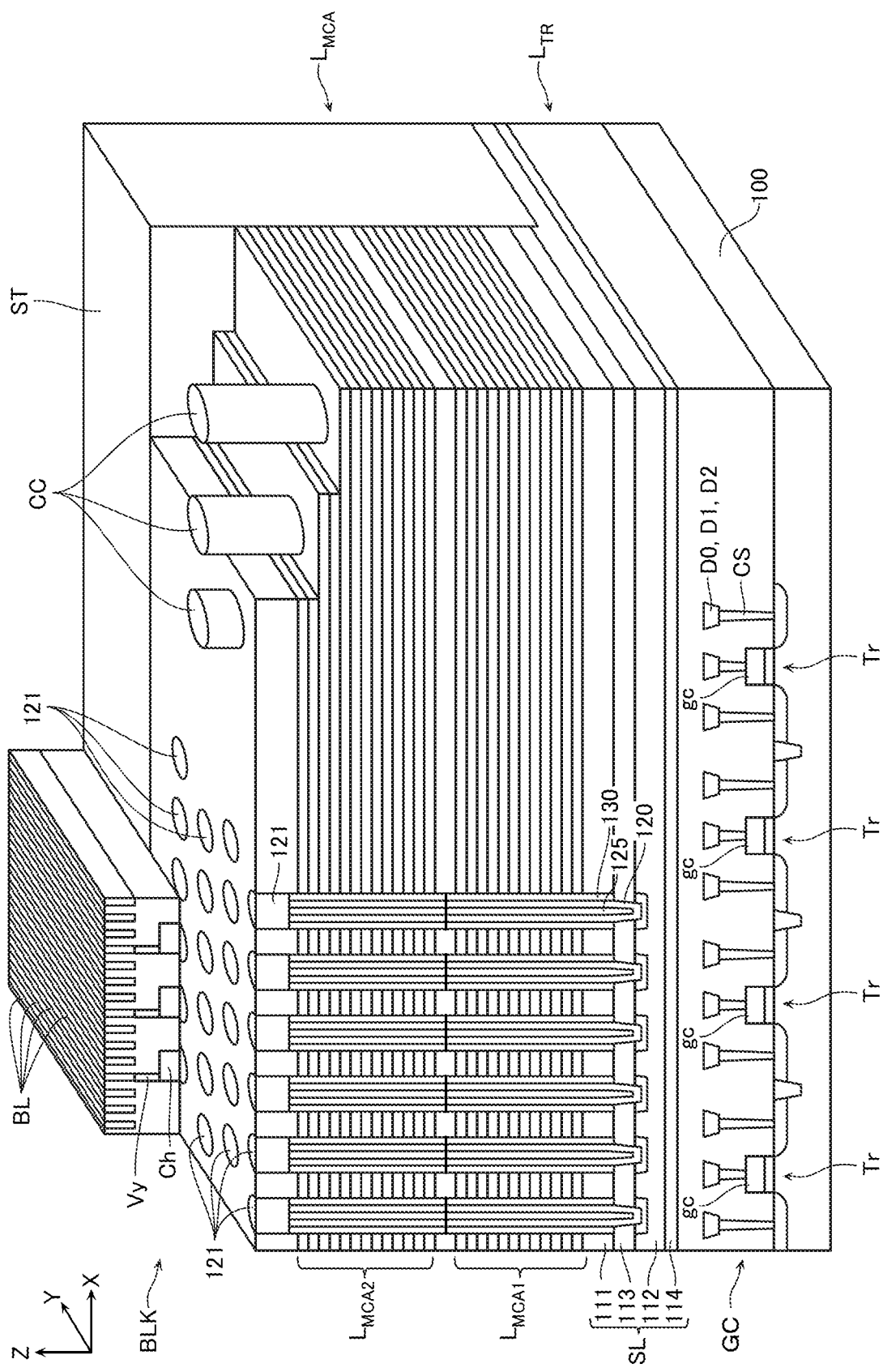
FIG. 6 is a schematic perspective view illustrating a configuration of a part of the memory die MD.
Figure 7:
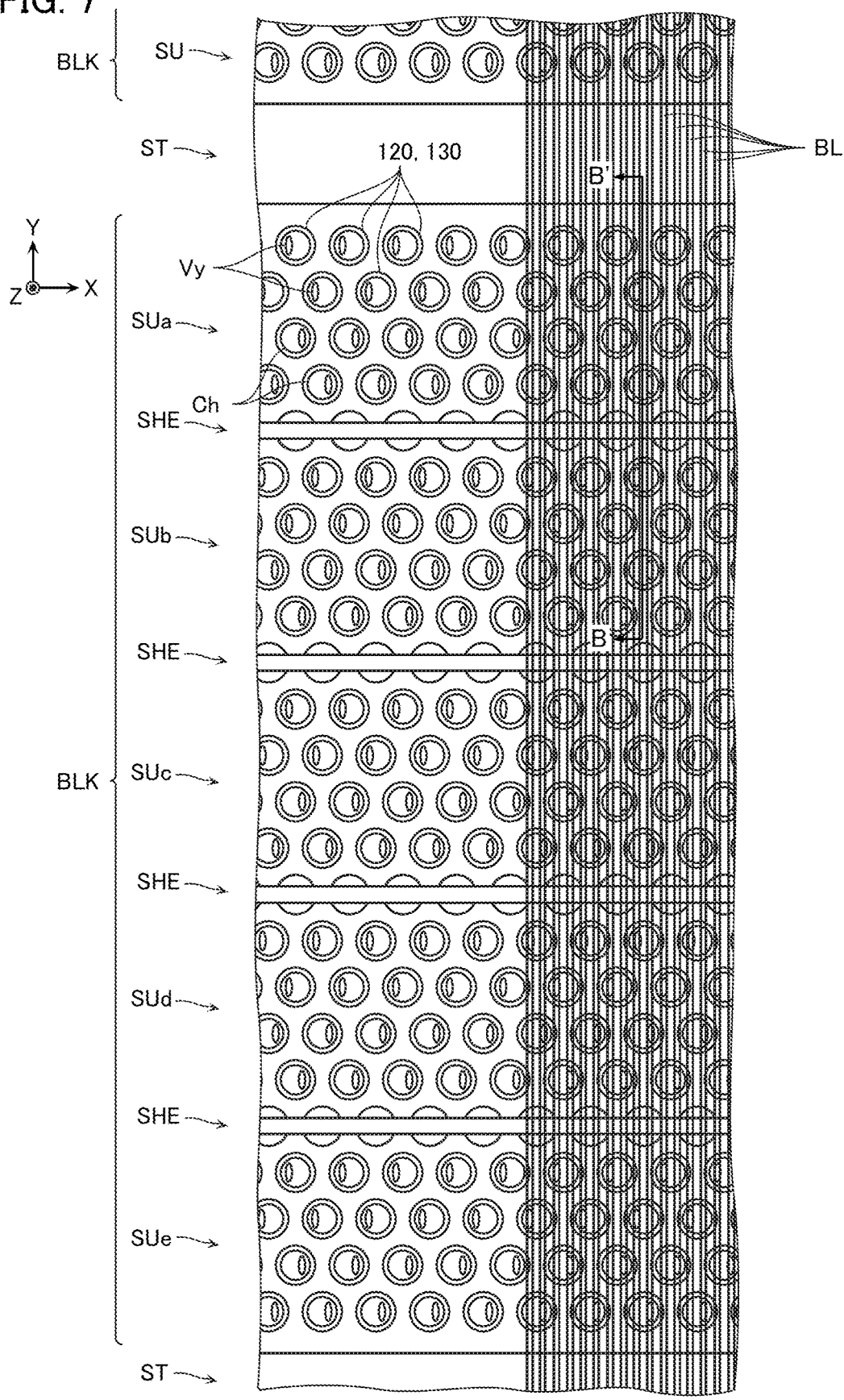
FIG. 7 is a schematic cross-sectional view illustrating a configuration of a part of the memory die MD.
Figure 8:
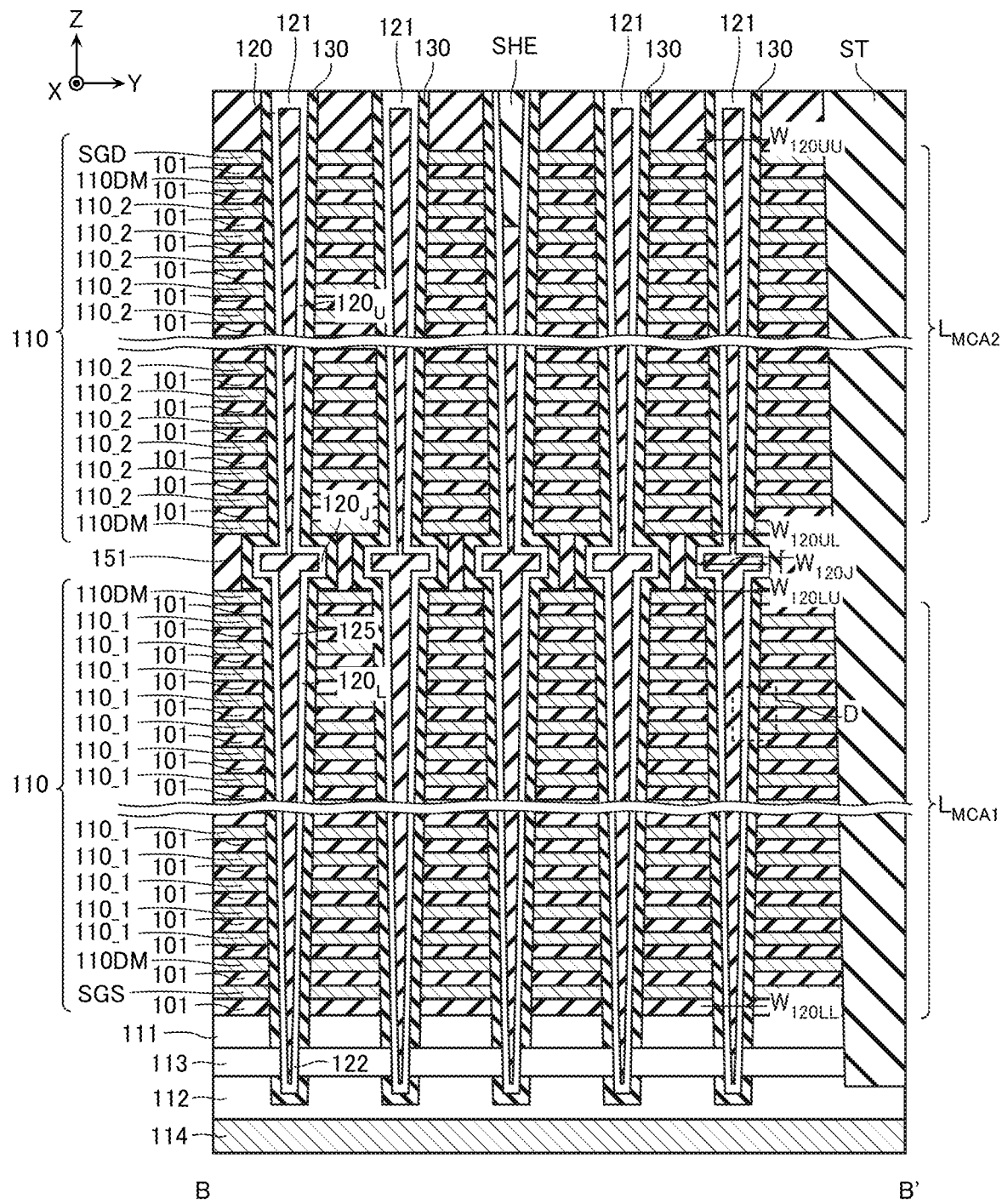
FIG. 8 is a schematic cross-sectional view illustrating a configuration of a part of the memory die MD.
Figure 9:
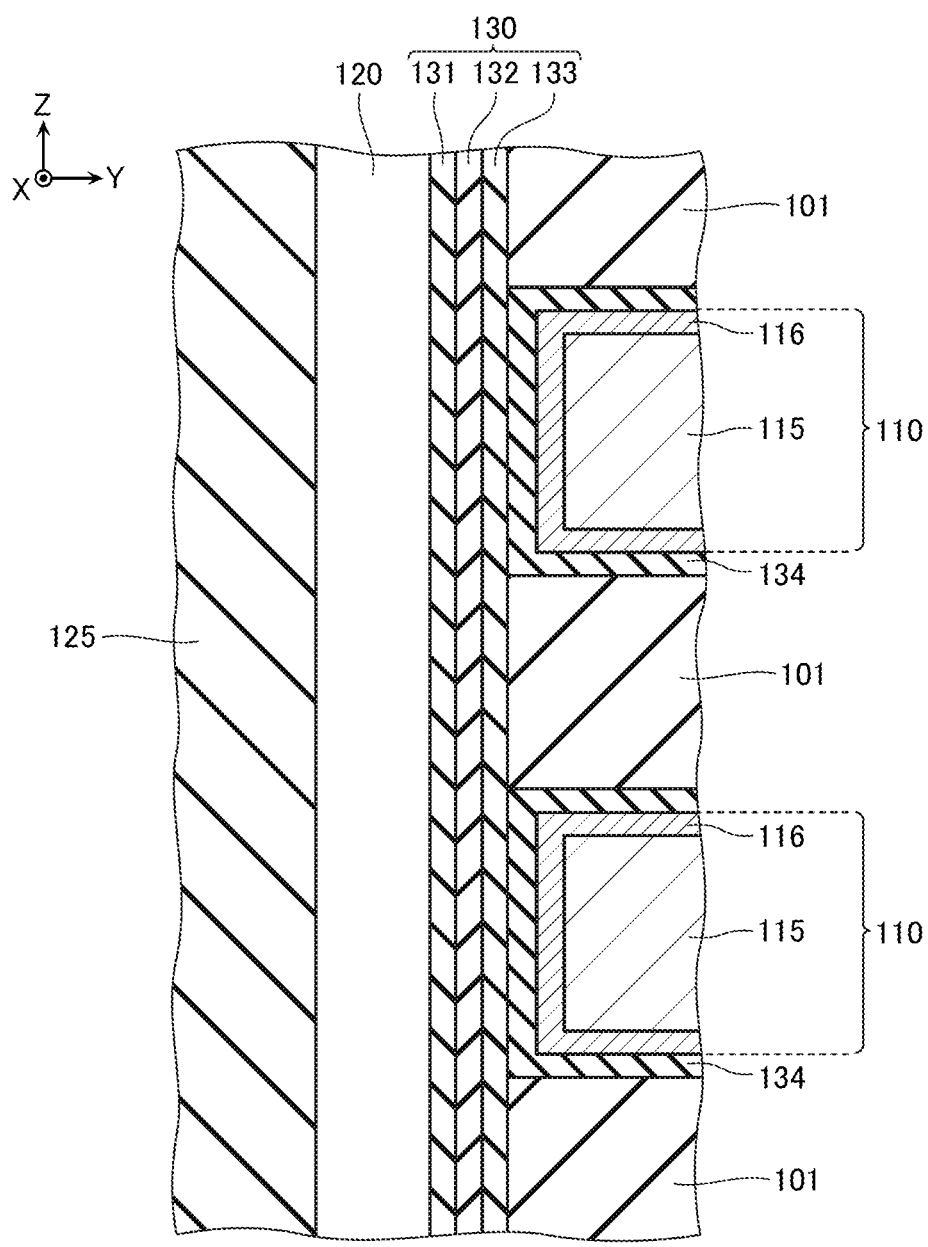
FIG. 9 is a schematic cross-sectional view illustrating a configuration of a part of the memory die MD.

FIG. 6 is a schematic perspective view illustrating the configuration of a part of the memory die MD. FIG. 7 is a schematic plan view illustrating the configuration of a part of the memory die MD. FIG. 8 is a schematic cross-sectional view taking the structure illustrated in FIG. 7 along the line B-B' and viewed in the arrow direction. FIG. 9 is a schematic cross-sectional view illustrating an enlarged region D illustrated in FIG. 8. For sake of convenience of explanation, FIG. 6 to FIG. 9 omit a part of a configuration.

For example, as illustrated in FIG. 6, the semiconductor memory device according to the embodiment includes a transistor layer $L_{TR}$ disposed on a semiconductor substrate 100 and a memory cell array layer $L_{MCA}$ disposed above the transistor layer $L_{TR}$.

[Structure of Transistor Layer $L_{TR}$]

For example, as illustrated in FIG. 6, a wiring layer GC is disposed above an upper surface of the semiconductor substrate 100 via an insulating layer (not illustrated). The wiring layer GC includes a plurality of electrodes gc opposed to a surface of the semiconductor substrate 100. The regions of the semiconductor substrate 100 and the plurality of electrodes gc included in the wiring layer GC are each connected to a contact CS.

The respective plurality of electrodes gc are opposed to the surface of the semiconductor substrate 100 and function as gate electrodes of a plurality of transistors Tr, electrodes of a plurality of capacitors, and the like constituting the peripheral circuit PC.

A plurality of the contacts CS extend in the Z-direction and are connected to the semiconductor substrate 100 or upper surfaces of the electrodes gc at lower ends. In a connection part between the contact CS and the semiconductor substrate 100, an impurity region containing N-type impurities or P-type impurities is disposed. For example, the contact CS may include a stacked film including a barrier conductive film, such as titanium nitride (TiN), and a metal film, such as tungsten (W).

Each of wiring layers D0, D1, D2 includes a plurality of wirings electrically connected to at least one of a configuration in the memory cell array MCA or the configuration in the peripheral circuit PC. For example, these plurality of wirings may include a stacked film including a barrier conductive film, such as titanium nitride (TiN), and a metal film, such as tungsten (W).

[Structure of Memory Cell Array Layer $L_{MCA}$]

As illustrated in FIG. 6, the memory cell array layer $L_{MCA}$ includes the memory block BLK. The memory block BLK includes a memory cell array layer $L_{MCA1}$ and a memory cell array layer $L_{MCA2}$ disposed above the memory cell array layer $L_{MCA1}$. As illustrated in FIG. 8, the memory cell array layer $L_{MCA1}$ and the memory cell array layer $L_{MCA2}$ include a plurality of conductive layers 110 arranged in the Z-direction, a plurality of semiconductor layers 120 extending in the Z-direction, and a respective plurality of gate insulating films 130 disposed between the plurality of conductive layers 110 and the plurality of semiconductor layers 120.

The conductive layer 110 is an approximately plate-shaped conductive layer extending in the X-direction. As illustrated in FIG. 9, the conductive layer 110 may include a stacked film including a barrier conductive film 116, such as titanium nitride (TiN), and a metal film 115, such as tungsten (W). Note that an insulating metal oxide film 134, such as alumina (AlO), may be disposed at a position of covering the outer periphery of the barrier conductive film 116. Additionally, for example, the conductive layer 110 may contain polycrystalline silicon containing impurities, such as phosphorus (P) or boron (B), or the like. Respective contacts CC (FIG. 6) are disposed on end portions in the X-direction of the plurality of conductive layers 110. Between the plurality of conductive layers 110 arranged in the Z-direction, an insulating layer 101 (FIG. 8), such as silicon oxide ($SiO_2$), is disposed.

As illustrated in FIG. 8, a semiconductor layer ill, a semiconductor layer 113, and a semiconductor layer 112 are disposed below the plurality of conductive layers 110 via the insulating layer 101. Between the semiconductor layer 111 and the semiconductor layer 112 and the semiconductor layer 120, a part of the gate insulating film 130 is disposed. The semiconductor layer 113 is connected to lower end portions of the semiconductor layers 120.

The semiconductor layer 113 has the upper surface connected to the semiconductor layer 111, and the lower surface connected to the semiconductor layer 112. A conductive layer 114 may be disposed on the lower surface of the semiconductor layer 112. The semiconductor layer 111, the semiconductor layer 113, the semiconductor layer 112, and the conductive layer 114 function as the source lines SL (FIG. 5). For example, the semiconductor layer 111, the semiconductor layer 113, and the semiconductor layer 112 contain polycrystalline silicon containing impurities, such as phosphorus (P) or boron (B), or the like. For example, the conductive layer 114 may contain a metal, such as tungsten (W), and any conductive layer including a conductive layer, such as tungsten silicide.

Among the plurality of conductive layers 110 disposed in the memory cell array layer $L_{MCA1}$ (FIG. 8), the conductive layers 110 positioned as the lowermost layers function as the source-side select gate line SGS (FIG. 5) and gate electrodes of a plurality of the source-side select transistors STS (FIG. 5) connected to this. This conductive layer 110 is electrically independent for each memory block BLK.

Among the plurality of conductive layers 110 disposed in the memory cell array layer $L_{MCA1}$ (FIG. 8), a part of the plurality of conductive layers 110 positioned above the conductive layers 110 that function as the source-side select gate line SGS and the like function as the word line WL and gate electrodes of the plurality of memory cells MC connected to this. Between these conductive layers 110 and the semiconductor layers 120, the memory cells MC described with reference to FIG. 5 are disposed. These plurality of conductive layers 110 are electrically independent for each memory block BLK.

Hereinafter, among the plurality of conductive layers 110 disposed in the memory cell array layer $L_{MCA1}$ (FIG. 8), a part of the conductive layers 110 that function as the word lines WL and the like (that function as the "usual word lines WL" and the gate electrodes of the "usual memory cells MC" described later) will be referred to as first gate electrodes 110_1. Additionally, among the plurality of conductive layers 110 disposed in the memory cell array layer $L_{MCA1}$ (FIG. 8), a part of the conductive layers 110 that function as the word lines WL and the like (that function as "dummy word lines WLD" and gate electrodes of the "dummy memory cells DMC" described later) will be referred to as dummy conductive layers 110DM.

A part of the conductive layers 110 among the plurality of conductive layers 110 disposed in the memory cell array layer $L_{MCA2}$ (FIG. 8) function as the word lines WL and gate electrodes of the plurality of memory cells MC connected thereto. Between these conductive layers 110 and the semiconductor layer 120, the memory cells MC described with reference to FIG. 5 are disposed. These plurality of conductive layers 110 are electrically independent for each memory block BLK.

Additionally, among the plurality of conductive layers 110 disposed in the memory cell array layer $L_{MCA2}$ (FIG. 8), one or plurality of conductive layers 110 positioned above the conductive layers 110 that function as the word lines WL and the like function as the drain-side select gate line SGD and gate electrodes of the plurality of drain-side select transistors STD connected to this. These plurality of conductive layers 110 have widths in the Y-direction smaller than those of the other conductive layers 110. Between two conductive layers 110 adjacent in the Y-direction, an inter-string unit insulating layer SHE is disposed. These plurality of conductive layers 110 are electrically independent for each string unit SU.

Hereinafter, among the plurality of conductive layers 110 disposed in the memory cell array layer $L_{MCA2}$ (FIG. 8), a part of the conductive layers 110 that function as the word lines WL and the like (that function as the "usual word lines WL" and the gate electrodes of the "usual memory cells MC" described later) will be referred to as second gate electrodes 110_2. Additionally, among the plurality of conductive layers 110 disposed in the memory cell array layer $L_{MCA2}$ (FIG. 8), a part of the conductive layers 110 that function as the word lines WL and the like (that function as the "dummy word lines WLD" and the gate electrodes of the "dummy memory cells DMC" described later) will be referred to as dummy conductive layers 110DM.

For example, as illustrated in FIG. 7, the semiconductor layers 120 are arranged in a predetermined pattern in the X-direction and the Y-direction. The semiconductor layers 120 function as channel regions of the plurality of memory cells MC and the select transistors (STD, STS) included in one memory string MS (FIG. 5). The semiconductor layer 120 includes, for example, polycrystalline silicon (Si) or the like. The semiconductor layer 120 has, for example, as illustrated in FIG. 6, an approximately closed-bottomed cylindrical shape and includes an insulating layer 125, such as silicon oxide, at its center part.

As illustrated in FIG. 8, the semiconductor layer 120 includes a semiconductor region $120_L$ included in the memory cell array layer $L_{MCA1}$ and a semiconductor region $120_U$ included in the memory cell array layer $L_{MCA2}$. The semiconductor layer 120 includes a semiconductor region $120_J$ connected to an upper end of the semiconductor region $120_L$ and a lower end of the semiconductor region $120_U$, an impurity region 122 connected to a lower end of the semiconductor region $120_L$, and an impurity region 121 connected to an upper end of the semiconductor region $120_U$.

The semiconductor region $120_L$ is an approximately cylindrical-shaped region extending in the Z-direction. Each of the semiconductor regions $120_L$ has an outer peripheral surface surrounded by the plurality of conductive layers 110 included in the memory cell array layer $L_{MCA1}$ and is opposed to the plurality of conductive layers 110.

The semiconductor region $120_U$ is an approximately cylindrical-shaped region extending in the Z-direction. Each of the semiconductor regions $120_U$ has an outer peripheral surface surrounded by the plurality of conductive layers 110 included in the memory cell array layer $L_{MCA2}$ and is opposed to the plurality of conductive layers 110.

The semiconductor region $120_J$ is disposed above the plurality of conductive layers 110 included in the memory cell array layer $L_{MCA1}$ and disposed below the plurality of conductive layers 110 included in the memory cell array layer $L_{MCA2}$.

The impurity region 122 is connected to the semiconductor layer 113. The impurity region 122, for example, contains N-type impurities, such as phosphorus (P), and P-type impurities, such as boron (B). In the semiconductor layer 120, the part positioned immediately above the impurity region 122 functions as the channel region of the source-side select transistor STS.

The impurity region 121, for example, contains N-type impurities, such as phosphorus (P). The impurity region 121 is connected to the bit lines BL via a contact Ch and a contact Vy (FIG. 6).

The gate insulating film 130 has an approximately cylindrical shape covering an outer peripheral surface of the semiconductor layer 120. For example, as illustrated in FIG. 9, the gate insulating film 130 includes a tunnel insulating film 131, an electric charge accumulating film 132, and a block insulating film 133 stacked between the semiconductor layer 120 and the conductive layers 110. The tunnel insulating film 131 and the block insulating film 133 are, for example, insulating films, such as silicon oxide ($SiO_2$). The electric charge accumulating film 132 is, for example, a film of silicon nitride ($Si_3N_4$) or the like that can accumulate electric charge. The tunnel insulating film 131, the electric charge accumulating film 132, and the block insulating film 133 have approximately cylindrical shapes, and extend in the Z-direction along the outer peripheral surface of the semiconductor layer 120.

Note that the gate insulating film 130, for example, may include a floating gate, such as polycrystalline silicon, containing N-type or P-type impurities.

In the example of FIG. 7, the memory block BLK includes five string units SUa to SUe disposed from one side in the Y-direction (the Y-direction positive side in FIG. 7) to the other side in the Y-direction (the Y-direction negative side in FIG. 7). Each of these plurality of string units SUa to SUe corresponds to the string unit SU described with reference to FIG. 5. Between two string units SU adjacent in the Y-direction, the inter-string unit insulating layer SHE of, for example, silicon oxide ($SiO_2$) is disposed. Between two memory blocks BLK adjacent in the Y-direction, an inter-block structure ST is disposed.

As illustrated in FIG. 6, the inter-block structure ST extends in the Z-direction and the X-direction. As illustrated in FIG. 8, the inter-block structure ST is a structure body that separates the plurality of insulating layers 101, the plurality of conductive layers 110, the semiconductor layer 111, and the semiconductor layer 113 in the Y-direction and reaches the semiconductor layer 112. The inter-block structure ST is, for example, an insulating layer of, for example, silicon oxide ($SiO_2$). Note that the inter-block structure ST may include a conductive layer of, for example, tungsten extending in the X-direction and the Z-direction at the center in the Y-direction, and an lower end of this conductive layer may be connected to the semiconductor layer 112.

[Dummy Conductive Layer 110DM]

One or a plurality of the dummy conductive layers 110DM may be disposed between the first gate electrode 110_1 and the source-side select gate line SGS. Additionally, one or plurality of dummy conductive layers 110DM may be disposed between the second gate electrode 110_2 and the drain-side select gate line SGD.

Among the plurality of conductive layers 110 disposed in the memory cell array layer $L_{MCA1}$, one or plurality of conductive layers 110 closest to the semiconductor region $120_J$ may be disposed as the dummy conductive layer 110DM.

Among the plurality of conductive layers 110 disposed in the memory cell array layer $L_{MCA2}$, one or plurality of conductive layers 110 closest to the semiconductor region $120_J$ may be disposed as the dummy conductive layer 110DM.

That is, the dummy conductive layer 110DM may be disposed between the first gate electrode 110_1 and the second gate electrode 110_2.

The dummy conductive layers 110DM function as the dummy word line WLD (FIG. 14) and gate electrodes of the plurality of dummy memory cells DMC (FIG. 14) connected to this. The dummy word line WLD is disposed as a part of the word line WL among the plurality of word lines WL. Hereinafter, among the plurality of word lines WL, the plurality of word lines WL other than the dummy word line WLD or a word line WL$_{ND}$ described later will be referred to as the "usual word lines WL" in some cases. The dummy word line WLD has a configuration basically similar to that of the usual word line WL. However, in the read operation, the write operation, and the erase operation, a voltage applied to the dummy word line WLD differs from the voltage applied to the usual word line WL in some cases.

The dummy memory cell DMC is disposed between the dummy word line WLD and the semiconductor layer 120. The dummy memory cell DMC is disposed as a part of the memory cell MC among the plurality of memory cells MC. Hereinafter, among the plurality of memory cells MC, the plurality of memory cells MC other than the dummy memory cell DMC or a memory cell MC$_{ND}$ described later will be referred to as the "usual memory cells MC" in some cases. The dummy memory cell DMC has a configuration basically similar to that of the usual memory cell MC. However, the user data is not stored in the dummy memory cell DMC. As described later, a threshold voltage of the dummy memory cell DMC is adjusted to be a predetermined magnitude required for the read operation, the write operation, and the erase operation in some cases.

[Widths in Radial Directions of Semiconductor Regions 120$_L$, 120$_U$, 120$_J$]

Next, the widths in the radial directions of the semiconductor regions 120$_L$, 120$_U$, 120$_J$ will be described. Hereinafter, in this specification, the width in the X-direction or the Y-direction intersecting with the Z-direction as an extension direction of the semiconductor regions 120$_L$, 120$_U$ of the semiconductor layer will be referred to as a width in the radial direction. Note that, for sake of convenience of explanation, FIG. 8 or the like illustrates the width in the Y-direction as the width in the radial direction.

A width W$_{120LL}$ in the radial direction of the lower end portion of the semiconductor region 120$_L$ (for example, a part positioned below the plurality of conductive layers 110 included in the memory cell array layer L$_{MCA1}$) is smaller than a width W$_{120LU}$ in the radial direction of the upper end portion of the semiconductor region 120$_L$ (for example, a part positioned above the plurality of conductive layers 110 included in the memory cell array layer L$_{MCA1}$). That is, the width in the radial direction of the semiconductor region 120$_L$ becomes small as it lowers.

A width W$_{120UL}$ in the radial direction of a lower end portion of the semiconductor region 120$_U$ (for example, a part positioned below the plurality of conductive layers 110 included in the memory cell array layer L$_{MCA2}$) is smaller than a width W$_{120UU}$ in the radial direction of an upper end portion of the semiconductor region 120$_U$ (for example, a part positioned above the plurality of conductive layers 110 included in the memory cell array layer L$_{MCA2}$). That is, a width in the radial direction of the semiconductor region 120$_U$ decreases as it lowers and is the smallest in the vicinity immediately above the semiconductor region 120$_J$.

A width W$_{120J}$ in the radial direction of the semiconductor region 120$_J$ is larger than the width W$_{120LU}$ in the radial direction of the semiconductor region 120$_L$ and the width W$_{120UL}$ in the radial direction of the semiconductor region 120$_U$.

[Threshold Voltage of Memory Cell MC Storing One-Bit Data]

Next, with reference to FIG. 10, the threshold voltage of the memory cell MC storing the one-bit data will be described.

Figure 10:
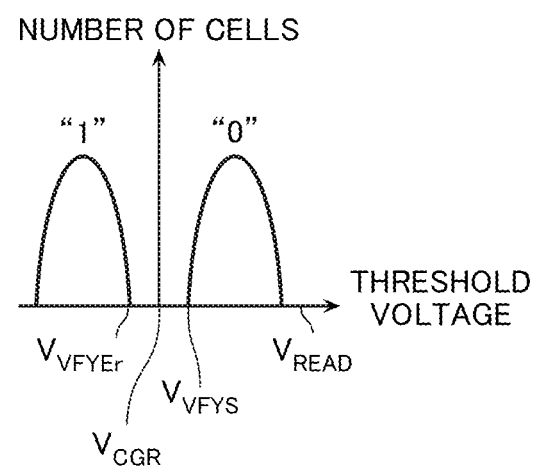
FIG. 10 is a schematic histogram for describing a threshold voltage of a memory cell MC storing one-bit data.

FIG. 10 is a schematic histogram for describing the threshold voltage of the memory cell MC at which one-bit data is stored. The horizontal axis indicates the voltage of the word line WL and the vertical axis indicates the number of the memory cells MC.

In the example of FIG. 10, the threshold voltage of the memory cell MC is controlled to be in two states. For example, the threshold voltage of the memory cell MC controlled to be in a lower state is smaller than an erase verify voltage V$_{VFYEr}$. The threshold voltage of the memory cell MC controlled to be in an upper state is larger than a verify voltage V$_{VFYS}$ and smaller than a read pass voltage V$_{READ}$.

In the example of FIG. 10, a read voltage V$_{CGR}$ is set between a threshold distribution corresponding to the lower state and a threshold distribution corresponding to the upper state.

For example, the lower state corresponds to the low threshold voltage. The memory cell MC in the lower state is, for example, the memory cell MC in the erase state. For example, data "1" is assigned to the memory cell MC in the lower state.

The upper state corresponds to the high threshold voltage. The memory cell MC in the upper state is, for example, the memory cell MC in the write state. For example, data "0" is assigned to the memory cell MC in the upper state.

[Threshold Voltage of Memory Cell MC Storing a Plurality of Bits]

Figure 11:
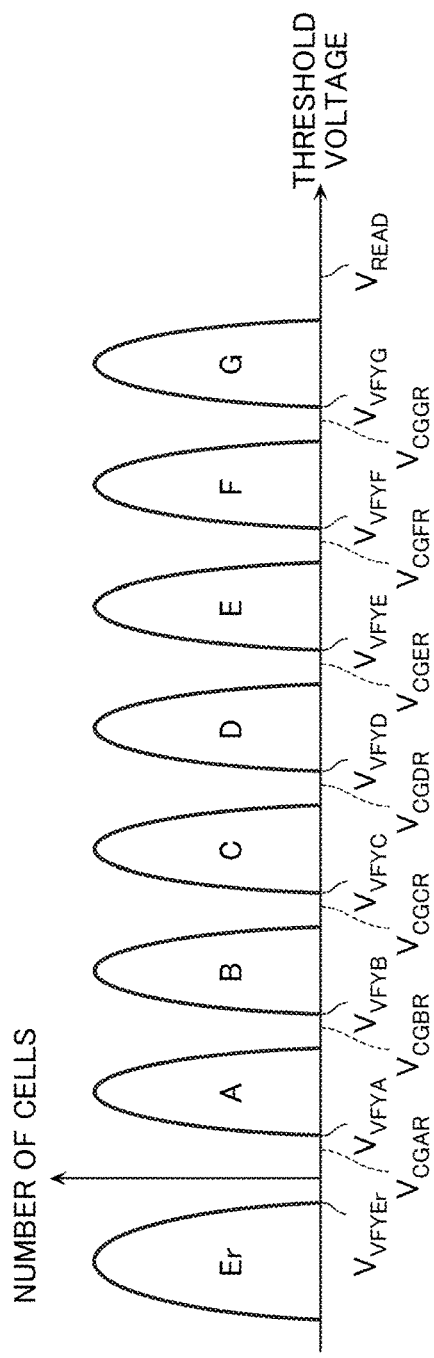
FIG. 11A, FIG. 11B, and FIG. 11C are schematic histograms for describing a threshold voltage of the memory cell MC storing three-bit data.

Next, with reference to FIG. 11A, FIG. 11B, and FIG. 11C, the threshold voltage of the memory cell MC storing data of a plurality of bits will be described. FIG. 11A, FIG. 11B, and FIG. 11C illustrate the threshold voltage of the memory cell MC storing three-bit data as an example.

FIG. 11A is a schematic histogram for describing the threshold voltage of the memory cell MC storing the three-bit data. The horizontal axis indicates the voltage of the word line WL, and the vertical axis indicates the number of memory cells MC. FIG. 11B is a table showing an example of a relation between the threshold voltage of the memory cell MC storing the three-bit data and the stored data. FIG. 11C is a table showing another example of the relation between the threshold voltage of the memory cell MC storing the three-bit data and the stored data.

In the example of FIG. 11A, the threshold voltages of the memory cells MC are controlled in eight states. The threshold voltage of the memory cell MC controlled in a state Er is smaller than the erase verify voltage V$_{VFYEr}$. For example, the threshold voltage of the memory cell MC controlled in a state A is larger than a verify voltage V$_{VFYA}$ and smaller than a verify voltage V$_{VFYB}$. Additionally, for example, the threshold voltage of the memory cell MC controlled in a state B is larger than the verify voltage V$_{VFYB}$ and smaller than a verify voltage V$_{VFYC}$. Hereinafter, similarly, the threshold voltages of the memory cells MC controlled in a state C to a state F are larger than the verify voltage V$_{VFYC}$ to a verify voltage V$_{VFYF}$ and smaller than a verify voltage V$_{VFYD}$ to a verify voltage V$_{VFYG}$, respectively. For example, the threshold voltage of the memory cell MC controlled in a state G is larger than the verify voltage $V_{VFYG}$ and smaller than the read pass voltage $V_{READ}$.

In the example in FIG. 11A, a read voltage $V_{CGAR}$ is set between a threshold distribution corresponding to the state Er and a threshold distribution corresponding to the state A. A read voltage $V_{CGBR}$ is set between the threshold distribution corresponding to the state A and a threshold distribution corresponding to the state B. Hereinafter, similarly, a read voltage $V_{CGBR}$ and a read voltage $V_{CGGR}$ are set between the threshold distribution corresponding to the state B and a threshold distribution corresponding to the state C, and between a threshold distribution corresponding to the state F and a threshold distribution corresponding to the state G, respectively.

For example, the state Er corresponds to the lowest threshold voltage. The memory cell MC in the state Er is, for example, the memory cell MC in an erase state. For example, data "111" is assigned to the memory cell MC in the state Er.

The state A corresponds to the threshold voltage larger than the threshold voltage corresponding to the state Er. For example, data "101" is assigned to the memory cell MC in the state A.

The state B corresponds to the threshold voltage larger than the threshold voltage corresponding to the state A. For example, data "001" is assigned to the memory cell MC in the state B.

Hereinafter, similarly, the state C to the state G in the drawing correspond to threshold voltages larger than the threshold voltages corresponding to the state B to the state F. For example, data "011", "010", "110", "100", and "000" are assigned to the memory cells MC in these states.

In the case of the assignment as exemplified in FIG. 11B, the data of a lower bit is distinguishable with one read voltage $V_{CGAR}$ The data of a middle bit is distinguishable with three read voltages $V_{CGAR}$, $V_{CGCR}$, $V_{CGFR}$ The data of an upper bit is distinguishable with three read voltages $V_{CGBR}$, $V_{CGER}$, $V_{CGGR}$. This assignment of data will be referred to as a 1-3-3 code in some cases.

The number of bits of the data stored in the memory cell MC, the number of states, the assignment of the data to each state, and the like are changeable as necessary.

For example, in the case of the assignment as exemplified in FIG. 11C, the data of the lower bit is distinguishable with one read voltage $V_{CGGR}$ The data of the middle bit is distinguishable with the two read voltages $V_{CGBR}$, $V_{CGFR}$. The data of the upper bit is distinguishable with the four read voltages $V_{CGAR}$, $V_{CGCR}$, $V_{CGER}$, $V_{CGGR}$. This assignment of data will be referred to as a 1-2-4 code in some cases.

[Erase Operation]

Figure 12:
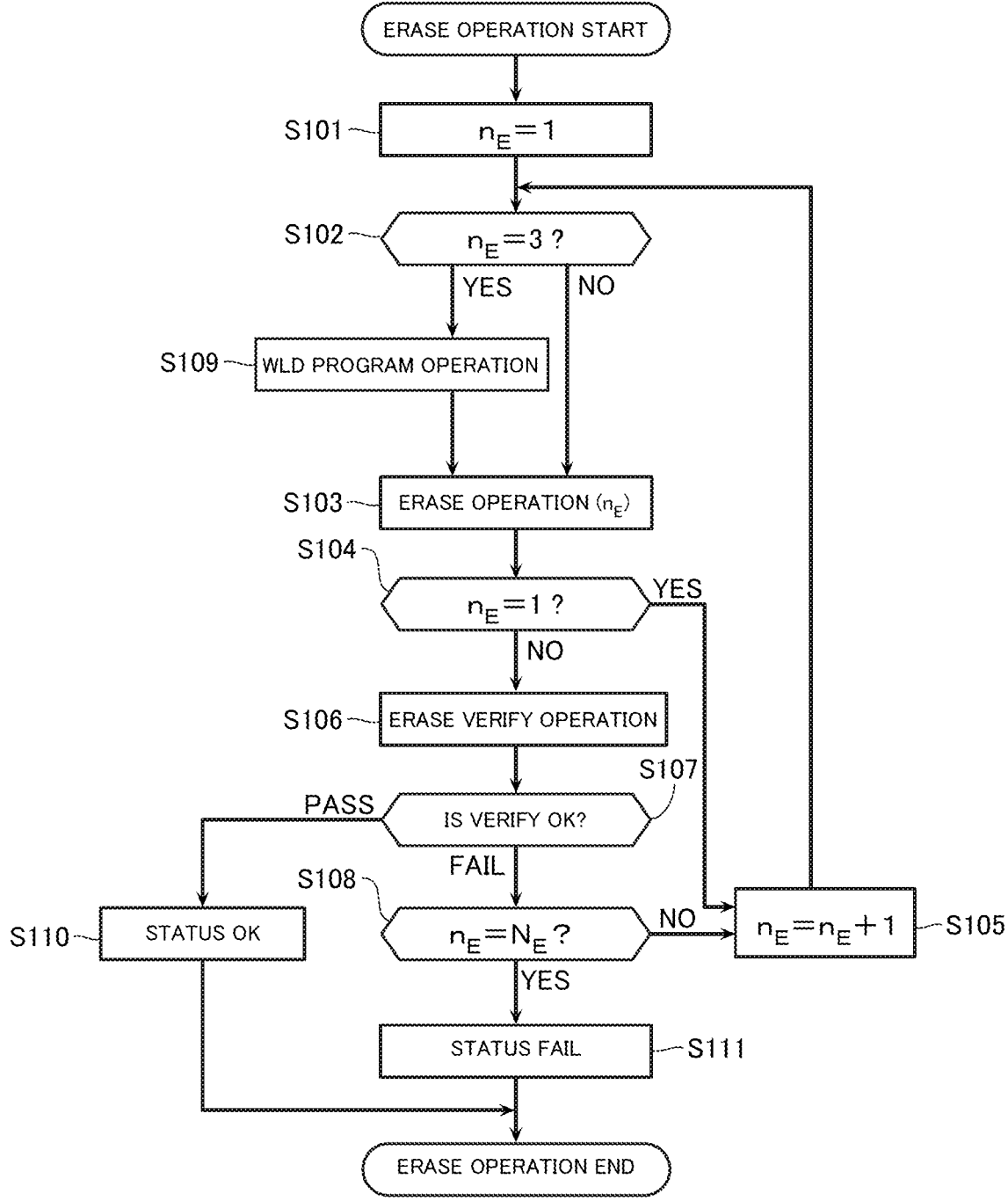
FIG. 12 is a flowchart for describing an operation method of the memory die MD.
Figure 13:
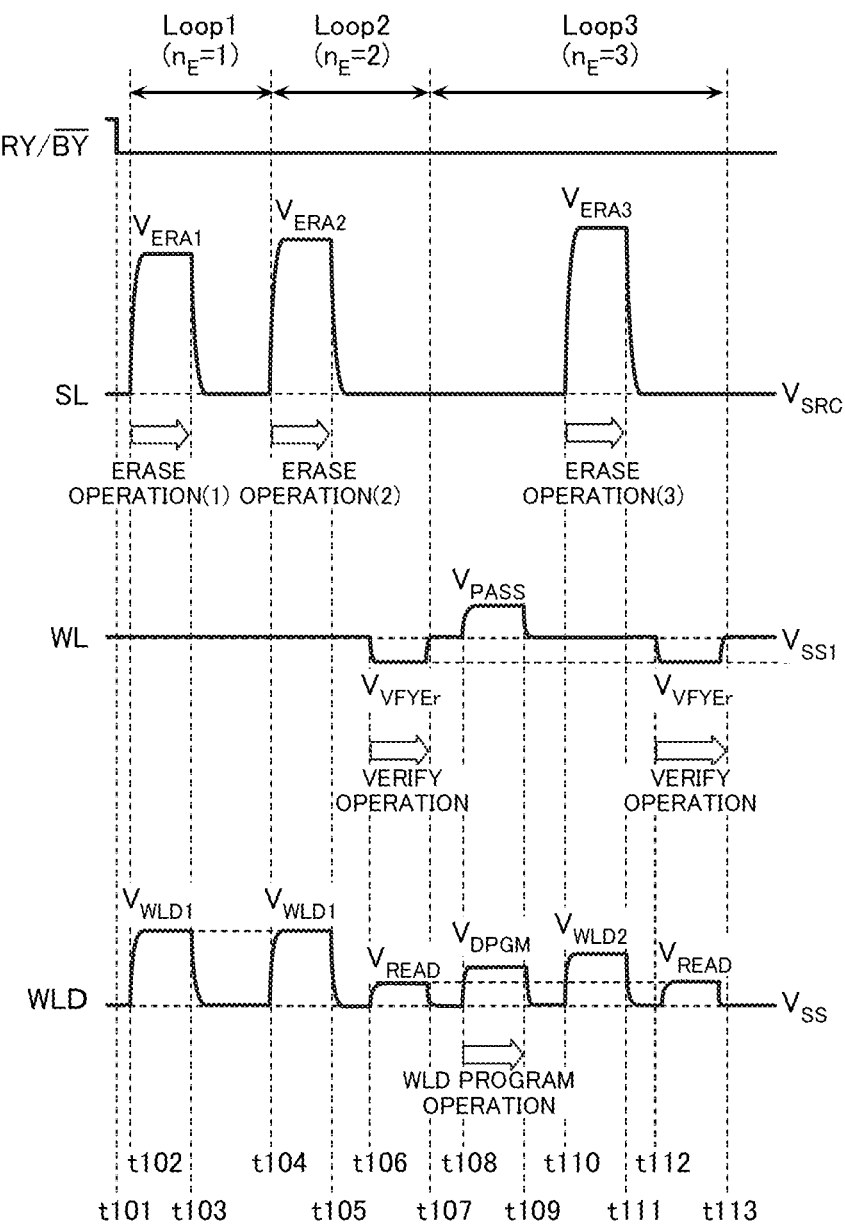
FIG. 13 is a timing chart for describing the operation method of the memory die MD.
Figure 14:
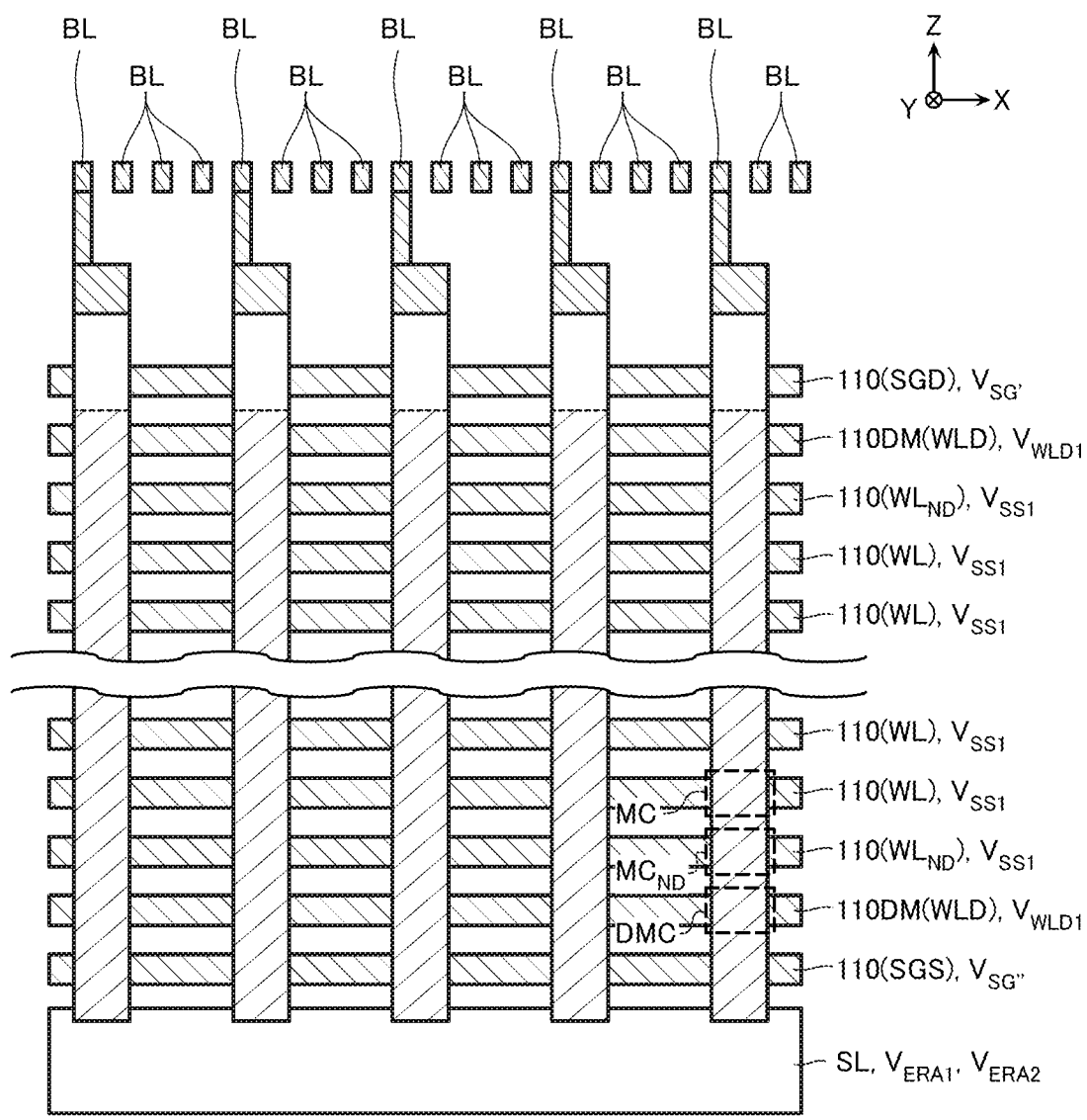
FIG. 14 is a schematic cross-sectional view for describing the operation method of the memory die MD.
Figure 15:
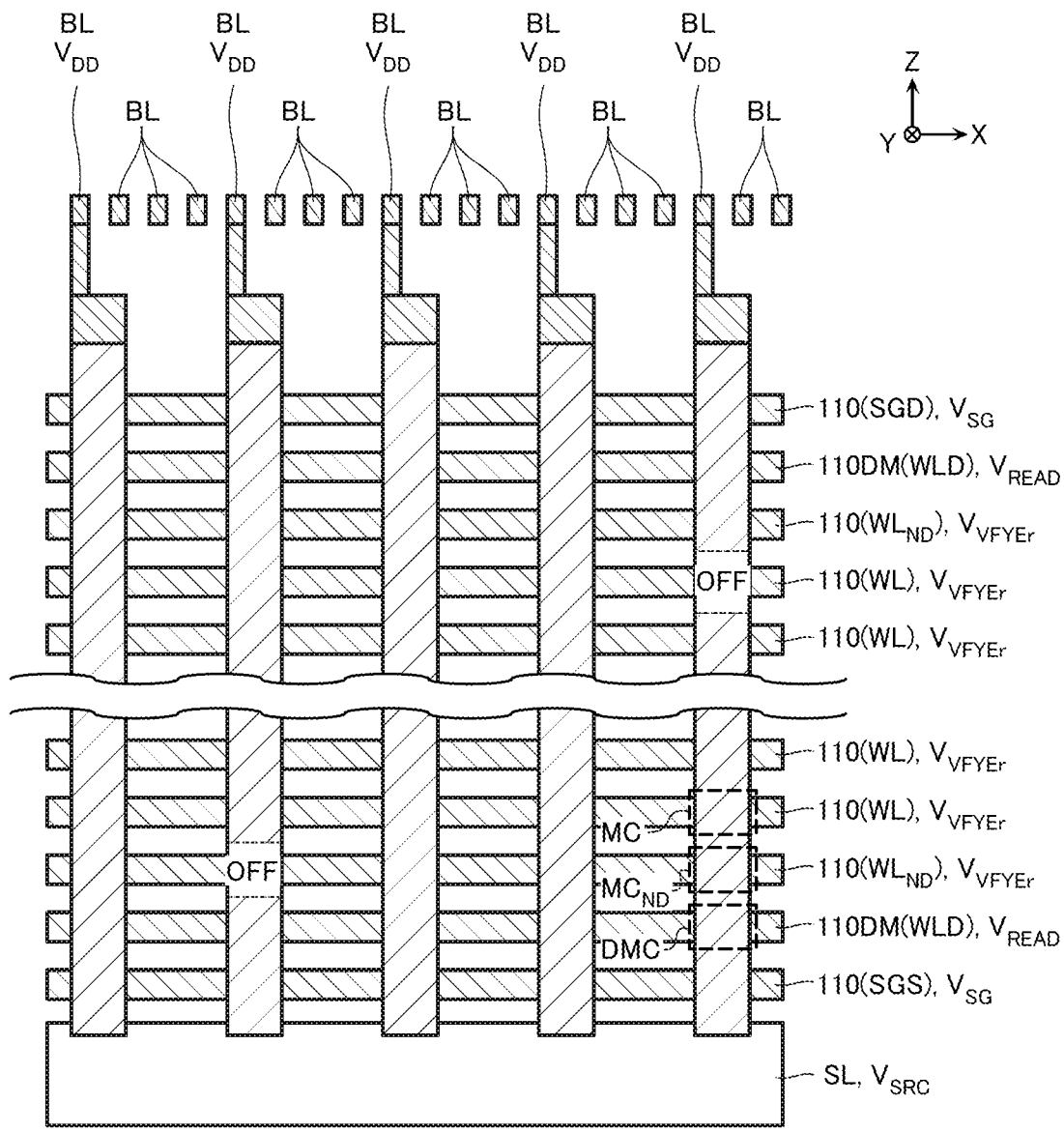
FIG. 15 is a schematic cross-sectional view for describing the operation method of the memory die MD.
Figure 16:
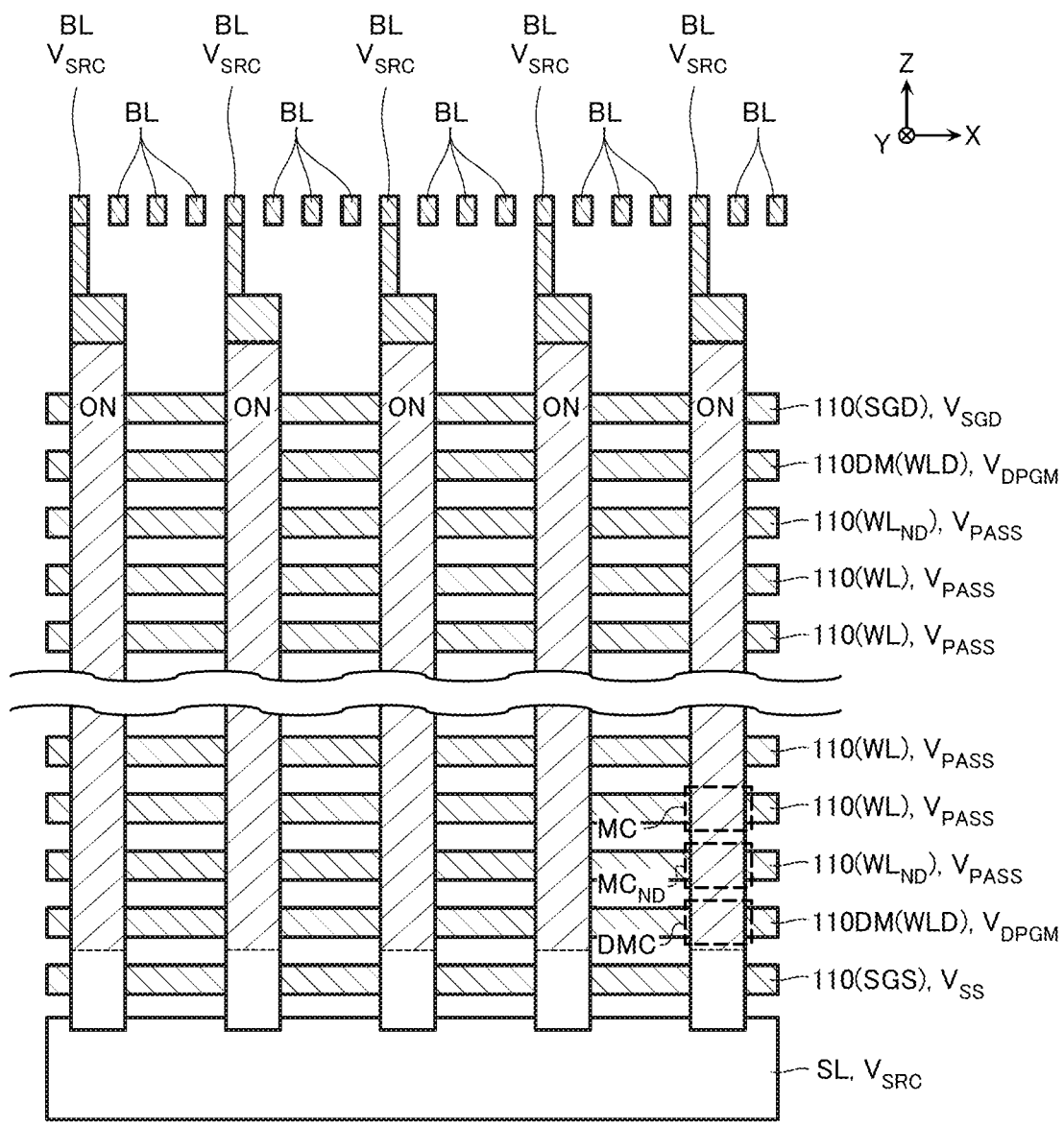
FIG. 16 is a schematic cross-sectional view for describing the operation method of the memory die MD.
Figure 17:
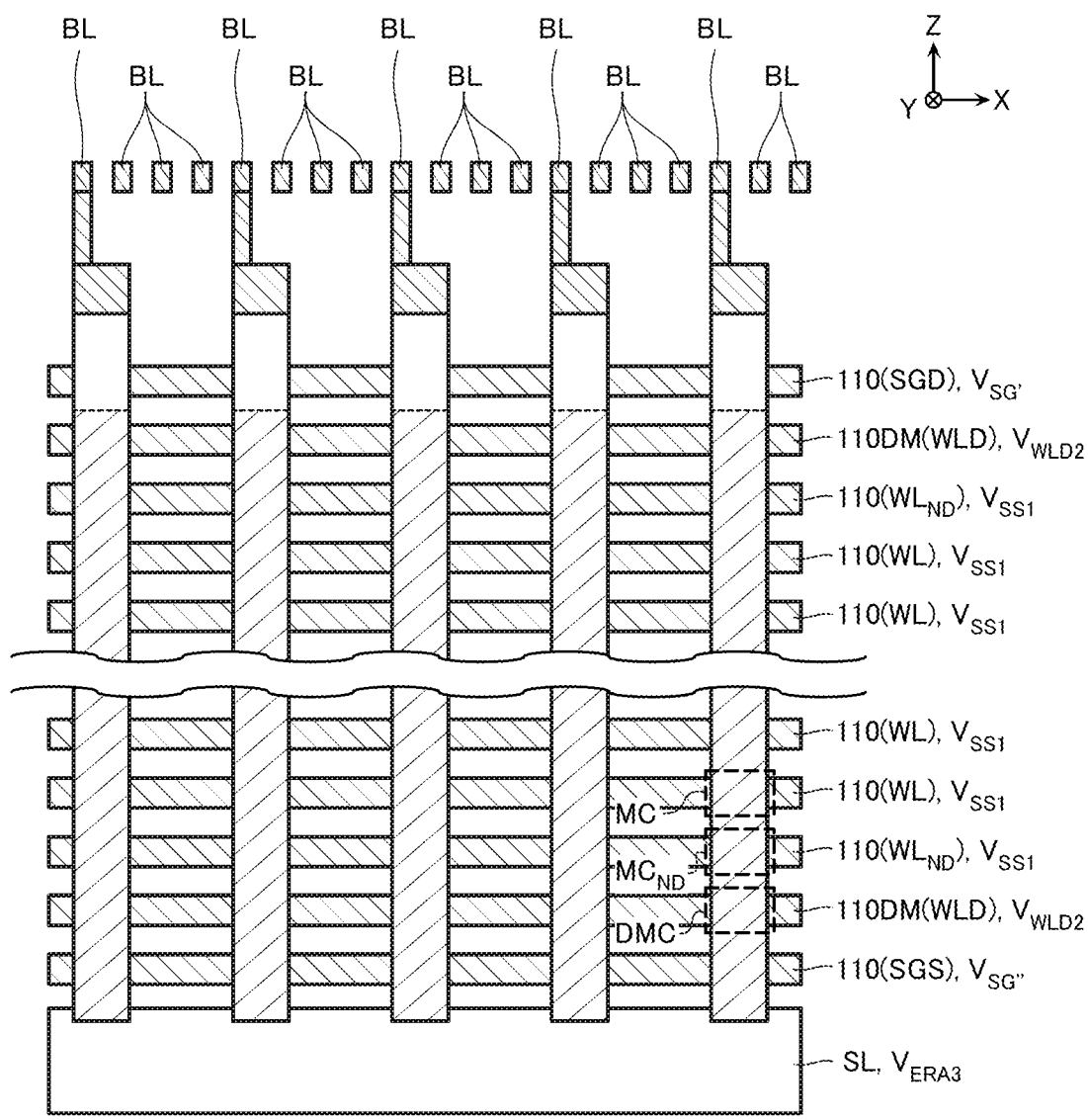
FIG. 17 is a schematic cross-sectional view for describing the operation method of the memory die MD.

Next, the erase operation of the semiconductor memory device according to the embodiment will be described. FIG. 12 is a flowchart for describing the erase operation. FIG. 13 is a timing chart for describing the erase operation. FIG. 14 is a schematic cross-sectional view for describing an erase operation (1) and an erase operation (2) included in the erase operation. FIG. 15 is a schematic cross-sectional view for describing an erase verify operation included in the erase operation. FIG. 16 is a schematic cross-sectional view for describing a WLD program operation included in the erase operation. FIG. 17 is a schematic cross-sectional view for describing an erase operation (3) included in the erase operation.

In the following description, as illustrated in FIG. 14 to FIG. 17, the word line WL disposed between the dummy word line WLD and the usual word line WL will be referred to as the word line $WL_{ND}$ and the memory cell MC connected to the word line $WL_{ND}$ as the memory cell $MC_{ND}$. The word line $WL_{ND}$ has a configuration basically similar to that of the usual word line WL. However, in the read operation, the write operation, and the erase operation, a voltage applied to the word line $WL_{ND}$ differs from the voltage applied to the usual word line WL in some cases. For example, the word line $WL_{ND}$ is achieved by the conductive layer 110 one above each dummy conductive layer 110DM and the conductive layer 110 one below the dummy conductive layer 110DM. The memory cell $MC_{ND}$ has a configuration similar to that of the usual memory cell MC. Similarly to the usual memory cell MC, the user data is stored in the memory cell $MC_{ND}$.

In the following description, an example of performing the erase operation on the memory block BLK target for operation will be described.

[Steps of Erase Operation]

First, using FIG. 12, each of steps of the erase operation according to the embodiment will be described.

At Step S101, a loop count $n_E$ is set to 1.

At Step S102, whether the loop count $n_E$ is a predetermined count "3" or not is determined. When the loop count $n_E$ is not the predetermined count "3", the process proceeds to Step S103. When the loop count $n_E$ is the predetermined count "3", after the process proceeds to Step S109, the process proceeds to Step S103.

At Step S103, the erase operation ($n_E$) according to the loop count $n_E$ is performed. The erase operation ($n_E$) will be described later.

At Step S104, whether the loop count $n_E$ is a predetermined count "1" or not is determined. When the loop count $n_E$ is the predetermined count "1", the process proceeds to Step S105. When the loop count $n_E$ is not the predetermined count "1", the process proceeds to Step S106.

At Step S105, 1 is added to the loop count $n_E$, and the process proceeds to Step S102.

At Step S106, the erase verify operation is performed. The erase verify operation will be described later. After the erase verify operation, a counter circuit or the like (not illustrated) in the peripheral circuit PC (FIG. 1) counts the number of the usual memory cells MC and the memory cells $MC_{ND}$ whose threshold voltages reach the target value, or the number of the usual memory cells MC and the memory cells $MC_{ND}$ whose threshold voltages do not reach the target value.

At Step S107, the result of the erase verify operation is determined. For example, with reference to the counter circuit or the like, for example, when the number of the usual memory cells MC and the memory cells $MC_{ND}$ whose threshold voltages do not reach the target value is a certain value or more, it is determined to be verify FAIL, and the process proceeds to Step S108. On the other hand, for example, when the number of the usual memory cells MC and the memory cells $MC_{ND}$ whose threshold voltages do not reach the target value is the certain value or less, it is determined to be verify PASS, and the process proceeds to Step S110.

At Step S108, whether the loop count $n_E$ has reached the predetermined count $N_E$ or not is determined. When the loop count $n_E$ does not reach the predetermined count $N_E$, the process proceeds to Step S105. When the loop count $n_E$ reaches the predetermined count $N_E$, the process proceeds to Step S111.

At Step S109, the WLD program operation is performed. The WLD program operation will be described later.

At Step S110, the status data Stt indicative of normal termination of the erase operation is stored in the status register STR (FIG. 4) and the erase operation ends.

At Step S111, the status data Stt indicative of failing to normal termination of the erase operation is stored in the status register STR (FIG. 4), and the erase operation ends.

[Erase Operation Loop]

Next, each loop in the erase operation will be described. Note that, at timing t101 (FIG. 13) before starting the erase operation loop, the terminal RY/(/BY) changes from a "H" state to a "L" state, and access to the memory die MD is inhibited. Additionally, at the start of the erase operation loop, at Step S101 (FIG. 12), the loop count $n_E$ is set to 1.

[Erase Operation: Loop "1"]

The case where the loop count $n_E$ is "1" will be described. In FIG. 13, the loop "1" of the erase operation is performed from timing t102 to timing t104.

When the loop count $n_E$ is "1", at Step S102 (FIG. 12), the process proceeds to Step S103.

At Step S103 (FIG. 12), the erase operation (1) in the loop "1" is performed. For example, the erase operation (1) is performed from timing t102 to timing t103 in FIG. 13.

In the erase operation (1), for example, as illustrated in FIG. 14, a voltage $V_{SG'}$ is applied to the drain-side select gate line SGD and a voltage $V_{SG''}$ is applied to the source-side select gate line SGS. The voltage $V_{SG'}$ has a magnitude to the extent of the drain-side select transistor STD entering an OFF state. For example, when the semiconductor layer 113 (FIG. 8) contains P-type impurities, such as boron (B), the voltage $V_{SG''}$ has a magnitude to the extent of the source-side select transistor STS entering the ON state when the source-side select transistor STS is operated as a PMOS transistor. For example, when the semiconductor layer 113 (FIG. 8) contains N-type impurities, such as phosphorus (P), the voltage $V_{SG''}$ has a magnitude to the extent of generating a Gate Induced Drain Leakage (GIDL) in the source-side select transistor STS.

In the erase operation (1), as illustrated in FIG. 13 and FIG. 14, a first erase voltage $V_{ERA1}$ is applied to the source line SL and a first voltage $V_{SS1}$ is applied to the usual word line WL and the word line $WL_{ND}$. The first voltage $V_{SS1}$ may be same as the ground voltage $V_{SS}$ or may be smaller than or larger than it. Accordingly, a voltage difference $V_{ERA1}-V_{SS1}$ is applied to the usual memory cell MC connected to the usual word line WL and the memory cell $MC_{ND}$ connected to the word line $WL_{ND}$. Thus, the holes are injected into the electric charge accumulating film 132, and the threshold voltages of the usual memory cell MC and the memory cell $MC_{ND}$ decrease.

Additionally, in the erase operation (1), as illustrated in FIG. 13 and FIG. 14, a voltage $V_{WLD1}$ is applied to the dummy word line WLD. The voltage $V_{WLD1}$ is larger than the first voltage $V_{SS1}$ and smaller than the first erase voltage $V_{ERA1}$. Thus, a voltage difference $V_{ERA1}-V_{WLD1}$ is applied to the dummy memory cell DMC connected to the dummy word line WLD. The voltage difference $V_{ERA1}-V_{WLD1}$ applied to the dummy memory cell DMC is smaller than the voltage difference $V_{ERA1}-V_{SS1}$ applied to the usual memory cell MC. Accordingly, the threshold voltages of these dummy memory cells DMC do not decrease so much.

When the loop count $n_E$ is "1", at Step S104 (FIG. 12), the process proceeds to Step S105. That is, in the loop "1", the erase verify operation at Step S106 is not performed.

At Step S105 (FIG. 12), 1 is added to the loop count "1" such that the loop count becomes "2" and the process proceeds to Step S102.

[Erase Operation: Loop "2"]

Next, the case where the loop count $n_E$ is "2" will be described. In FIG. 13, the loop "2" of the erase operation is performed from timing t104 to timing t107.

When the loop count $n_E$ is "2", at Step S102 (FIG. 12), the process proceeds to Step S103.

At Step S103 (FIG. 12), the erase operation (2) in the loop "2" is performed. For example, the erase operation (2) is performed from timing t104 to timing t105 in FIG. 13.

In the erase operation (2), as illustrated in FIG. 13 and FIG. 14, the voltage similar to that of the erase operation (1) is basically applied. However, in the erase operation (2), a second erase voltage $V_{ERA2}$ same as or larger than the first erase voltage $V_{ERA1}$ is applied to the source line SL. Thus, the threshold voltages of the usual memory cell MC and the memory cell $MC_{ND}$ further decrease.

In the erase operation (2), similarly to the erase operation (1), the voltage $V_{WLD1}$ is applied to the dummy word line WLD. Thus, a voltage difference $V_{ERA2}-V_{WLD1}$ is applied to the dummy memory cell DMC connected to the dummy word line WLD. A voltage difference $V_{ERA2}-V_{WLD1}$ applied to the dummy memory cell DMC is smaller than the voltage difference $V_{ERA2}-V_{SS1}$ applied to the usual memory cell MC. Accordingly, the threshold voltages of these dummy memory cells DMC do not decrease so much.

When the loop count $n_E$ is "2", at Step S104 (FIG. 12), the process proceeds to Step S106.

At Step S106 (FIG. 12), the erase verify operation is performed. The erase verify operation in the loop "2" is, for example, performed from timing t106 to timing t107 in FIG. 13.

In the erase verify operation, for example, as illustrated in FIG. 13 and FIG. 15, a ground voltage $V_{SRC}$ is applied to the source line SL, a power supply voltage $V_{DD}$ is applied to the bit line BL, and the read pass voltage $V_{READ}$ is applied to the dummy word line WLD. The read pass voltage $V_{READ}$ is a voltage to the extent of the dummy memory cell DMC entering the ON state when the dummy memory cell DMC is operated as a NMOS transistor. A voltage $V_{SG}$ is applied to the select gate lines (SGD, SGS). The voltage $V_{SG}$ is a voltage to the extent of the select transistors (STD, STS) entering the ON state when the select transistors (STD, STS) is operated as the NMOS transistor.

Additionally, in the erase verify operation, the erase verify voltage $V_{VFYEr}$ is applied to the usual word line WL and the word line $WL_{ND}$. Thus, as illustrated in FIG. 15, the usual memory cell MC and the memory cell $MC_{ND}$ whose threshold voltages are same as or smaller than the erase verify voltage $V_{VFYEr}$ enter the ON state, and the usual memory cell MC and the memory cell $MC_{ND}$ whose threshold voltages are larger than the erase verify voltage $V_{VFYEr}$ enter the OFF state. The ON state/OFF state of these memory cells MC are detected by the sense amplifier module SAM (FIG. 4) via the bit lines BL to acquire the data indicating the state of these memory cells MC. The read pass voltage $V_{READ}$ is larger than the erase verify voltage $V_{VFYEr}$.

At Step S107 (FIG. 12), the result of the erase verify operation is determined. The case in which it is determined to be verify FAIL will be described below. At Step S108, the predetermined count $N_E$ is determined to be larger than "3". In this case, the process proceeds to Step S105.

At Step S105, 1 is further added to the loop count $n_E$ such that the loop count becomes "3" and the process proceeds to Step S102.

Note that the threshold voltage distributions of the plurality of usual memory cells MC, the plurality of memory cells $MC_{ND}$, and the plurality of dummy memory cells DMC at timing t107 of ending the loop "2" will be described later.

[Erase Operation: Loop "3"]

Next, the case where the loop count $n_E$ is "3" will be described. In FIG. 13, the loop "3" of the erase operation is performed from timing t107 to timing t113.

When the loop count $n_E$ is "3", at Step S102 (FIG. 12), the process proceeds to Step S109.

At Step S109 (FIG. 12), the WLD program operation is performed. For example, the WLD program operation is performed from timing t108 to timing t109 in FIG. 13.

In the WLD program operation, as illustrated in FIG. 13 and FIG. 16, the ground voltage $V_{SRC}$ is applied to the bit line BL and the source line SL, a voltage $V_{SGD}$ is applied to the drain-side select gate line SGD, and the ground voltage $V_{SS}$ is applied to the source-side select gate line SGS. The voltage $V_{SGD}$ has a magnitude to the extent of the drain-side select transistor STD entering the ON state when the drain-side select transistor STD is operated as the NMOS transistor. Thus, the drain-side select transistor STD enters the ON state and the source-side select transistor STS enters the OFF state.

Additionally, in the WLD program operation, a write pass voltage $V_{PASS}$ is applied to the usual word line WL and the word line $WL_{ND}$ and a program voltage $V_{DPGM}$ is applied to the dummy word line WLD. The write pass voltage $V_{PASS}$ has a magnitude to the extent of the memory cell MC entering the ON state when the memory cell MC is operated as the NMOS transistor. With the program voltage $V_{DPGM}$, the threshold voltage of the dummy memory cell DMC increases. The program voltage $V_{DPGM}$ is larger than the write pass voltage $V_{PASS}$.

At Step S103 (FIG. 12), the erase operation (3) in the loop "3" is performed. The erase operation (3) is, for example, performed from timing t110 to timing t111 in FIG. 13.

In the erase operation (3), as illustrated in FIG. 13 and FIG. 17, the voltage similar to that of the erase operation (1) is basically applied. However, in the erase operation (3), a third erase voltage $V_{ERA3}$ same as or larger than the second erase voltage $V_{ERA2}$ is applied to the source line SL. Thus, the threshold voltages of the usual memory cell MC and the memory cell $MC_{ND}$ further decrease.

Additionally, in the erase operation (3), unlike the erase operation (1) and the erase operation (2), a voltage $V_{WLD2}$ is applied to the dummy word line WLD. The voltage $V_{WLD2}$ is smaller than the voltage $V_{WLD1}$. Thus, a voltage difference $V_{ERA3}-V_{WLD2}$ is applied to the dummy memory cell DMC. The voltage difference $V_{ERA3}-V_{WLD2}$ is larger than the voltage difference $V_{ERA2}-V_{WLD1}$ in the erase operation (1) and the erase operation (2).

When the loop count $n_E$ is "3", at Step S104 (FIG. 12), the process proceeds to Step S106.

At Step S106 (FIG. 12), the erase verify operation similar to that of the loop "2" is performed. The erase verify operation in the loop "3" is, for example, performed from timing t112 to timing t113 in FIG. 13.

At Step S107 (FIG. 12), similarly to the loop "2", the result of the erase verify operation is determined. In the case of verify FAIL, the process proceeds to Step S108, and when the loop count "3" does not reach the predetermined count $N_E$, an erase operation in a loop "4" at and after Step S105 starts. In the case of verify PASS, the process proceeds to Step S110 and the erase operation ends.

Note that the threshold voltage distributions of the plurality of usual memory cells MC, the plurality of memory cells $MC_{ND}$, and the plurality of dummy memory cells DMC at timing t113 of ending the loop "3" will be described later.

[Threshold Voltage Distribution in Erase Operation]

Next, the threshold voltage distributions of the usual memory cell MC, the memory cell $MC_{ND}$, and the dummy memory cell DMC in the erase operation according to the embodiment will be described. FIG. 18A, FIG. 18B, FIG. 18C, FIG. 19A, FIG. 19B, and FIG. 19C are schematic histograms for describing the threshold voltage distribution in the erase operation.

[Threshold Voltage Distribution at End of Loop "2"]

Figure 18A:
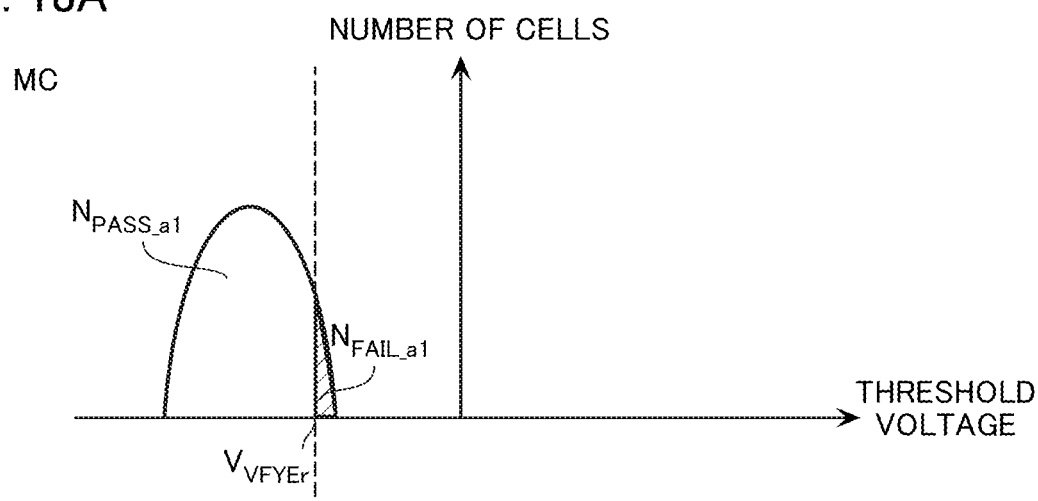
FIG. 18A, FIG. 18B, and FIG. 18C are schematic histograms for describing threshold voltages of the usual memory cell MC and a dummy memory cell DMC.

FIG. 18A is a histogram of the threshold voltage of the usual memory cell MC at the end of the loop "2" (timing t107). Among these usual memory cells MC, the number of cells whose threshold voltages fall below the erase verify voltage $V_{VFYEr}$ is expressed as the number of erase cells $N_{PASS\_a1}$ and the number of cells exceeding the erase verify voltage $V_{VFYEr}$ is expressed as the number of unerased cells $N_{FAIL\_a1}$.

Figure 18B:
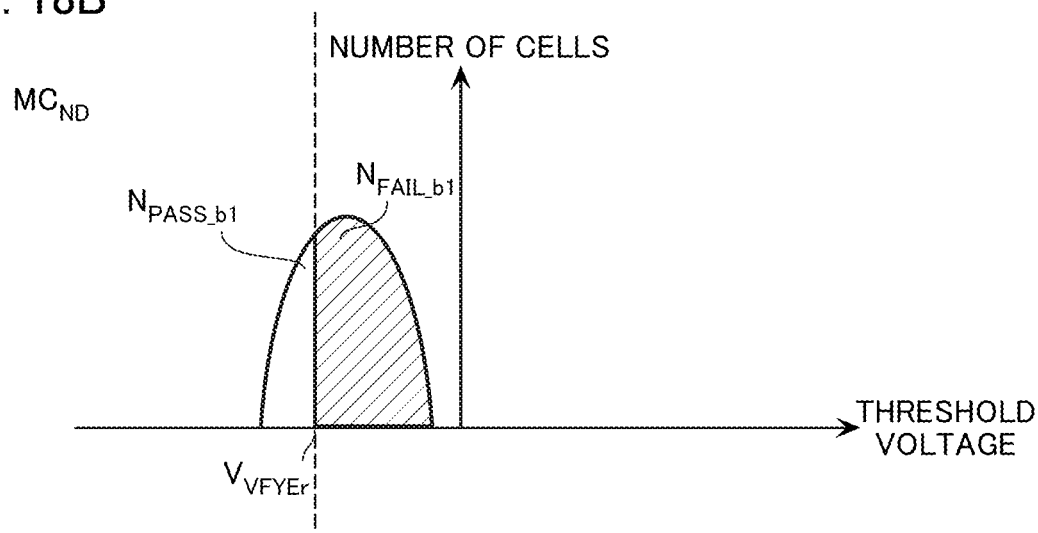

FIG. 18B is a histogram of the threshold voltage of the memory cell $MC_{ND}$ at the end of the loop "2" (timing t107). Among these memory cells $MC_{ND}$, the number of cells whose threshold voltages fall below the erase verify voltage $V_{VFYEr}$ is expressed as the number of erase cells $N_{PASS\_b1}$ and the number of cells exceeding the erase verify voltage $V_{VFYEr}$ is expressed as the number of unerased cells $N_{FAIL\_b1}$.

Figure 18C:
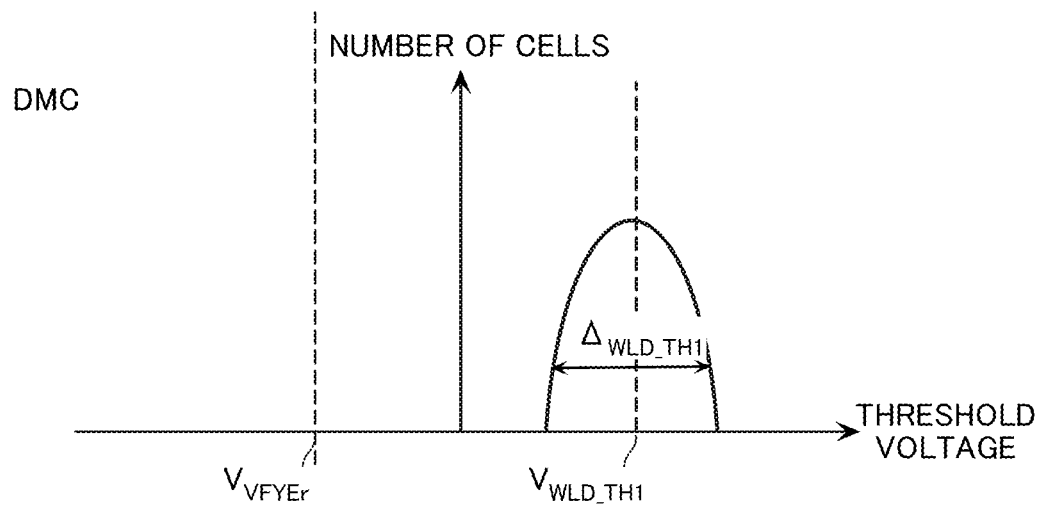

FIG. 18C is a histogram of the threshold voltage of the dummy memory cell DMC at the end of the loop "2" (timing t107). An average value and a distribution width of the threshold voltage distributions of these dummy memory cells DMC are expressed as a voltage $V_{WLD\_TH1}$ and a width $\Delta_{WLD\_TH1}$, respectively.

As illustrated in FIG. 18A and FIG. 18B, a proportion of the number of unerased cell $N_{FAIL\_b1}$ in the memory cells $MC_{ND}$ in the memory block BLK is larger than a proportion of the number of unerased cells $N_{FAIL\_a1}$ in the usual memory cells MC in the memory block BLK.

Here, as described above, in the erase operation (1) and the erase operation (2), between the channel region in the usual memory cell MC and the conductive layer 110 that functions as the usual word line WL, the voltage difference $V_{ERA1}-V_{SS1}$ or the voltage difference $V_{ERA2}-V_{SS1}$ is applied. Thus, the holes are injected into the electric charge accumulating film 132, and the threshold voltage of the usual memory cell MC decreases. Here, when the first voltage $V_{SS1}$ is applied to not only the usual word line WL connected to the usual memory cell MC, but also the word line WL adjacent to this usual word line WL, the voltage can be preferably applied to the gate insulating film 130. Thus, the holes can be preferably injected into the electric charge accumulating film 132.

Here, the word line $WL_{ND}$ connected to the memory cell $MC_{ND}$ is adjacent to the dummy word line WLD. Additionally, the voltage $V_{WLD1}$ applied to the gate insulating layer in the dummy memory cell DMC is larger than the first voltage $V_{SS1}$ applied to the gate insulating layers in the memory cells MC, $MC_{ND}$. Therefore, the effective voltage applied to the electric charge accumulating film 132 in the memory cell $MC_{ND}$ becomes smaller than the effective voltage applied to the electric charge accumulating film 132 in the usual memory cell MC in some cases. In this case, the holes cannot be preferably injected into the electric charge accumulating film 132, and the threshold voltage of the memory cell $MC_{ND}$ is less likely to decrease in some cases.

Note that as illustrated in FIG. 18C, at the end of the loop "2", the voltage $V_{WLD\_TH1}$ is sufficiently larger than the erase verify voltage $V_{VFYEr}$ and the width $\Delta_{WLD\_TH1}$ is comparatively narrow. This is because the voltage difference $V_{ERA2}-V_{WLD1}$ applied to the dummy memory cell DMC is sufficiently smaller than the voltage difference $V_{ERA2}-V_{SS1}$ applied to the memory cell MC, and therefore the threshold voltage of the dummy memory cell DMC never significantly decreases.

[Threshold Voltage Distribution at End of Loop "3"]

Figure 19A:
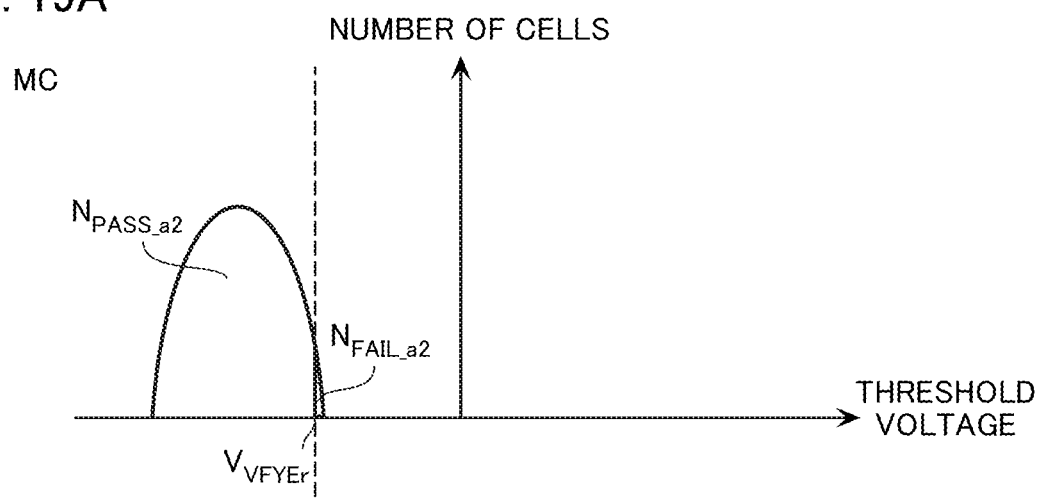
FIG. 19A, FIG. 19B, and FIG. 19C are schematic histograms for describing threshold voltages of the usual memory cell MC and the dummy memory cell DMC.

FIG. 19A is a histogram of the threshold voltage of the memory cell MC at the end of the loop "3" (timing t113). Among these memory cells MC, the number of cells whose threshold voltages fall below the erase verify voltage $V_{VFYEr}$ is expressed as the number of erase cells $N_{PASS\_a2}$ and the number of cells exceeding the erase verify voltage $V_{VFYEr}$ is expressed as the number of unerased cells $N_{FAIL\_a2}$.

Figure 19B:
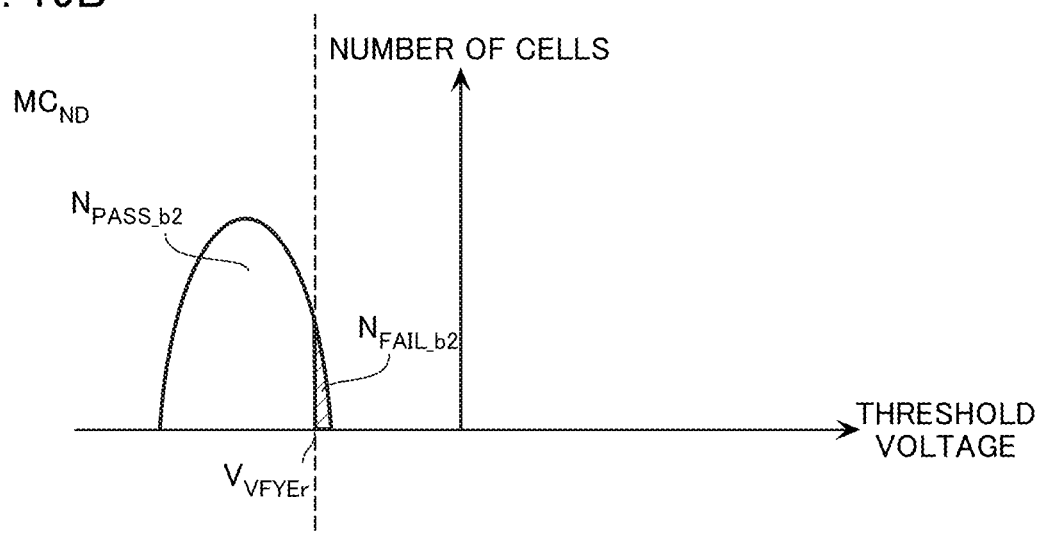

FIG. 19B is a histogram of the threshold voltage of the memory cell $MC_{ND}$ at the end of the loop "3" (timing t113). Among these memory cells $MC_{ND}$, the number of cells whose threshold voltages fall below the erase verify voltage $V_{VFYEr}$ is expressed as the number of erase cells $N_{PASS\_b2}$ and the number of cells exceeding the erase verify voltage $V_{VFYEr}$ is expressed as the number of unerased cells $N_{FAIL\_b2}$.

Figure 19C:
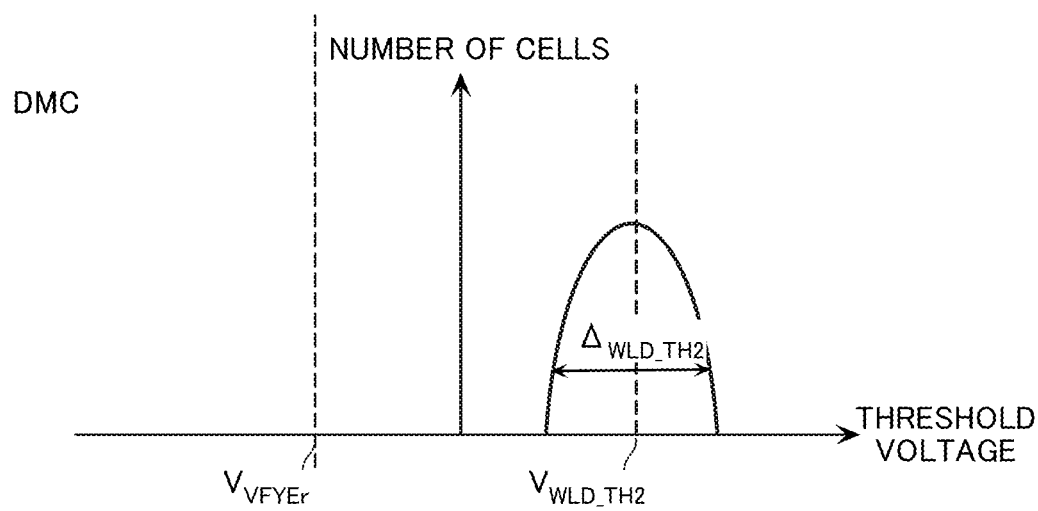

FIG. 19C is a histogram of the threshold voltage of the dummy memory cell DMC at the end of the loop "3" (timing t113). An average value and a distribution width of the threshold voltage distributions of these dummy memory cells DMC are expressed as a voltage $V_{WLD\_TH2}$ and a width $\Delta_{WLD\_TH2}$, respectively.

As illustrated in FIG. 19A and FIG. 19B, a proportion of the number of unerased cells $N_{FAIL\_a2}$ in the memory cells $MC_{ND}$ in the memory block BLK is the same extent of a proportion of the number of unerased cells $N_{FAIL\_a2}$ in the usual memory cells MC in the memory block BLK. That is, in the memory cell $MC_{ND}$ as well, the threshold voltage decreases to the same extent of the usual memory cell MC. This is because, in the loop "3", by application of the comparatively voltage difference $V_{ERA3}-V_{WLD2}$ to the dummy memory cell DMC, a comparatively large voltage is likely to be applied also to the gate insulating layer in the memory cell $MC_{ND}$ adjacent to the dummy memory cell DMC, and the threshold voltage of the memory cell $MC_{ND}$ is likely to decrease.

As illustrated in FIG. 19C, at the end of the loop "3" as well, the voltage $V_{WLD\_TH2}$ is sufficiently larger than the erase verify voltage $V_{VFYEr}$ and the width $\Delta_{WLD\_TH2}$ is comparatively narrow. Here, in the erase operation (3), by application of the comparatively large voltage difference $V_{ERA3}-V_{WLD2}$ to the gate insulating film 130 in the dummy memory cell DMC, the threshold voltage in the dummy memory cell DMC decreases compared with those in the erase operation (1) and the erase operation (2). Therefore, in the embodiment, the WLD program operation is performed at Step S109, and thus the threshold voltage of the dummy memory cell DMC is adjusted.

Comparative Example 1

Figure 20:
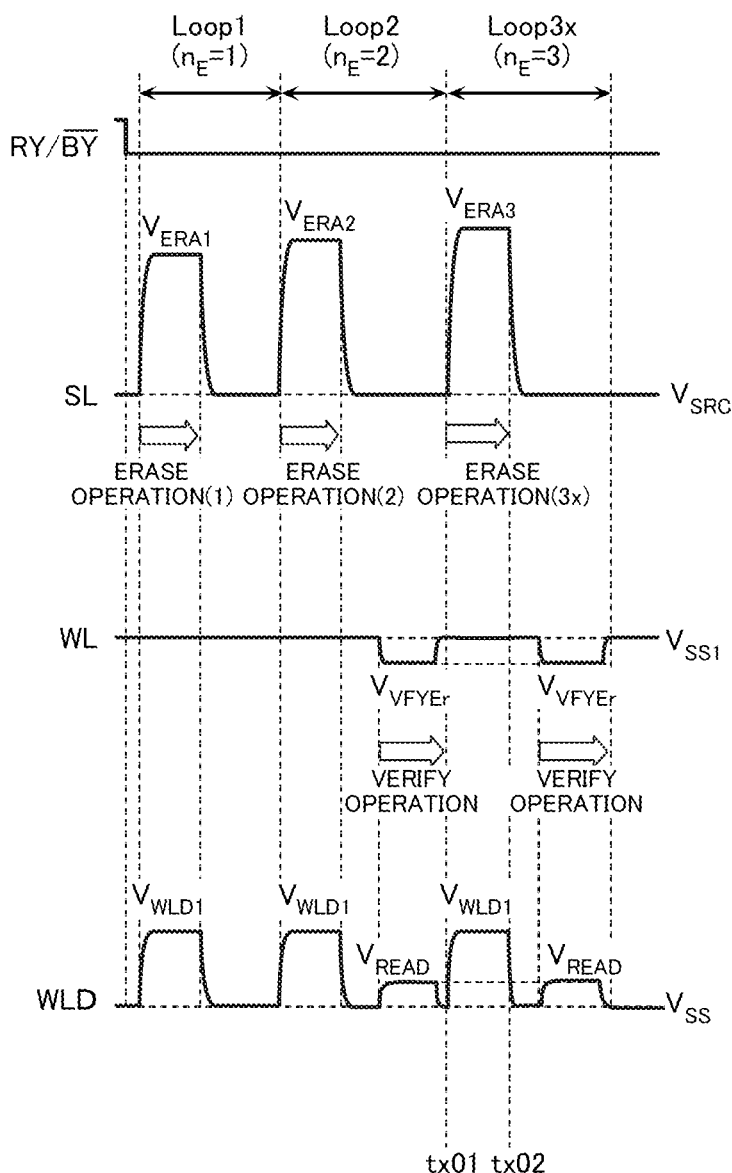
FIG. 20 is a timing chart for describing an erase operation of a semiconductor memory device according to Comparative Example 1.

FIG. 20 is a timing chart for describing an erase operation of the semiconductor memory device according to Comparative Example 1.

In the erase operation of the semiconductor memory device according to Comparative Example 1, instead of the loop "3" (FIG. 13) according to the first embodiment, a loop "3x" (FIG. 20) is performed. In the loop "3x", unlike the loop "3", the WLD program operation is not performed at the start of the loop.

In the erase operation of the semiconductor memory device according to Comparative Example 1, an erase operation (3x) is performed instead of the erase operation (3). In the erase operation (3x) from timing tx01 to timing tx02, the voltage $V_{WLD1}$ is applied to the dummy word line WLD, not the voltage $V_{WLD2}$ (FIG. 13).

[Threshold Distribution of Memory Cell MC in Erase Operation According to Comparative Example 1]

In Comparative Example 1, in the erase operations (1), (2), and (3x), the comparatively low voltage differences $V_{ERA1}-V_{WLD1}$, $V_{ERA2}-V_{WLD1}$, and $V_{ERA3}-V_{WLD1}$ are applied to the dummy memory cells DMC. Accordingly, the threshold voltage of the memory cell $MC_{ND}$ adjacent to the dummy memory cell DMC is less likely to decrease, and even after the loop "3x", the number of unerased memory cells $MC_{ND}$ increases in some cases.

Comparative Example 2

Figure 21:
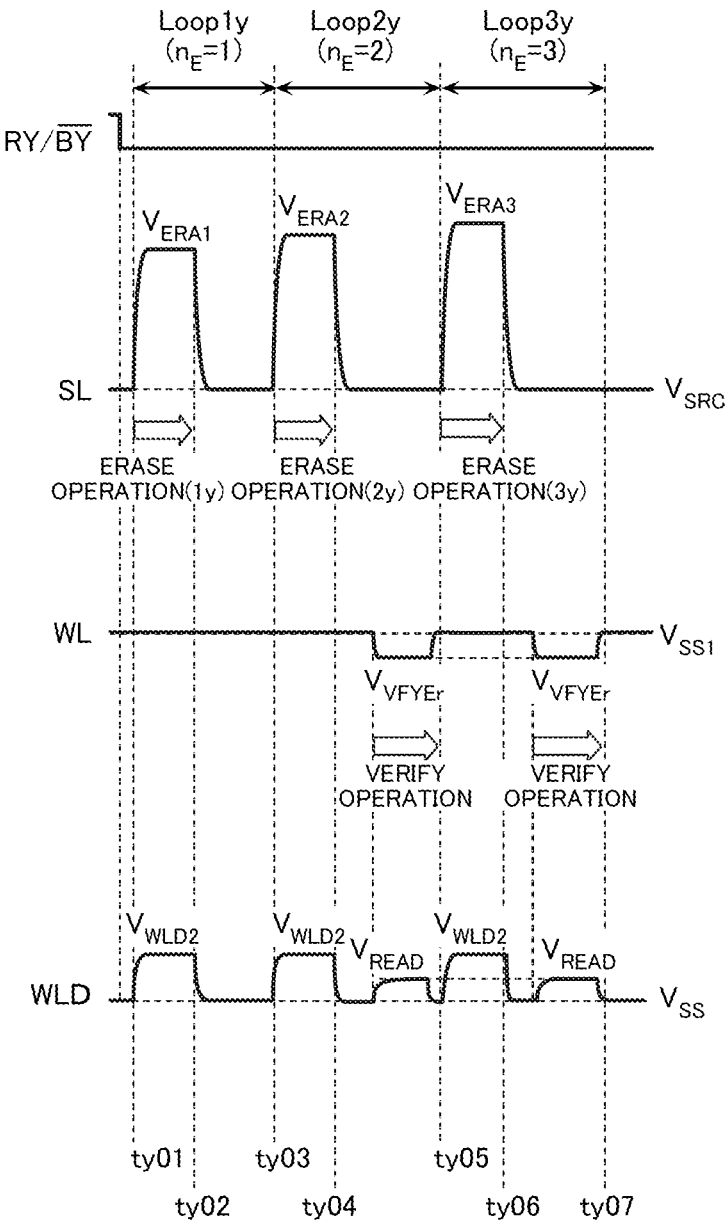
FIG. 21 is a timing chart for describing an erase operation of a semiconductor memory device according to Comparative Example 2.

FIG. 21 is a timing chart for describing an erase operation of the semiconductor memory device according to Comparative Example 2.

In the erase operation of the semiconductor memory device according to Comparative Example 2, instead of the loops "1", "2", and "3" (FIG. 13) according to the first embodiment, loops "1y", "2y", and "3y" (FIG. 21) are performed.

In the loop "1y" from timing ty01 to timing ty03, the erase operation (1y) is performed from timing ty01 to timing ty02.

In the loop "2y" from timing ty03 to timing ty05, the erase operation (2y) is performed from timing ty03 to timing ty04.

In the erase operation (1y) and the erase operation (2y), unlike the first embodiment, the voltage $V_{WLD2}$ smaller than the voltage $V_{WLD1}$ is applied to the dummy word line WLD.

In the loop "3y" from timing ty05 to timing ty07, unlike the loop "3" according to the first embodiment, the WLD program operation is not performed at the start of the loop "3y".

[Threshold Distribution of Memory Cell MC in Erase Operation According to Comparative Example 2]

Figure 22:
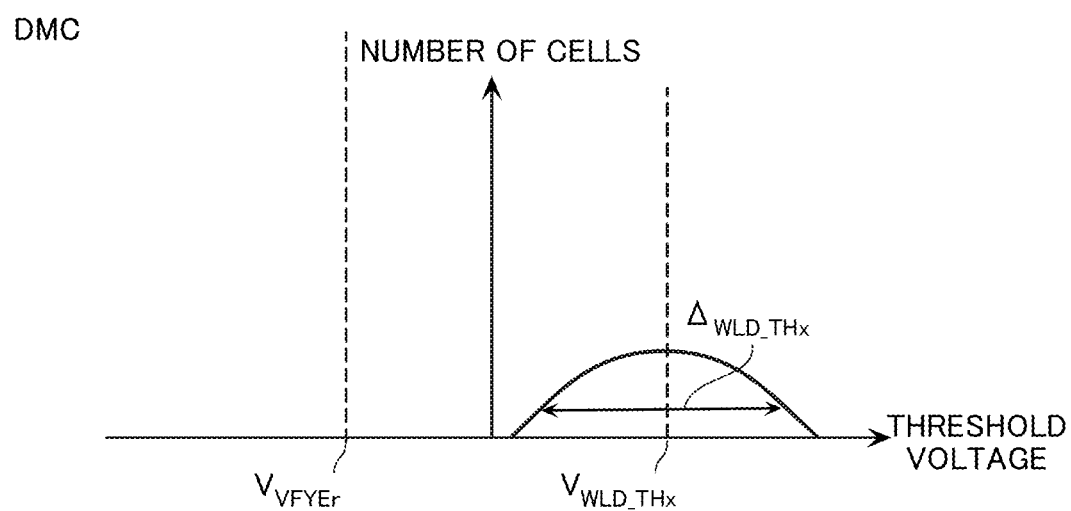
FIG. 22 is a schematic histogram for describing a threshold voltage of the dummy memory cell DMC according to Comparative Example 2.

Next, the threshold distribution of the dummy memory cell DMC at the end of the loop "3y" (timing ty07) in the erase operation according to Comparative Example 2 will be described. FIG. 22 is a schematic histogram for describing the threshold voltage of the dummy memory cell DMC.

In FIG. 22, for example, an average value and a distribution width of the threshold voltage distributions of the dummy memory cells DMC when the data writing and the erase operation are repeated by a plurality of times are expressed as a voltage $V_{WLD\_THx}$ and a width $\Delta_{WLD\_THx}$, respectively. As illustrated in FIG. 22, the width $\Delta_{WLD\_THx}$ is larger than the width $\Delta_{WLD\_TH2}$ (FIG. 19C). That is, in the erase operation in Comparative Example 2, there may be a case where a variation of the threshold voltage of the dummy memory cell DMC is large. This is considered due to the following reason. That is, in the loops "1y" to "3y", since the comparatively large voltage difference $V_{ERA2}-V_{WLD2}$ is applied to the dummy memory cell DMC, the comparatively many holes are supplied to the electric charge accumulating film 132 (see FIG. 9) in the dummy memory cell DMC. Here, when the erase operation is continued to be performed, the holes are continued to be supplied to the dummy memory cell DMC, and the threshold voltage of the dummy memory cell DMC decreases until a certain time point. However, when the erase operation is further performed, the electrons in the conductive layer 110 are supplied to the inside of the electric charge accumulating film 132, and on the contrary, the voltage of the dummy memory cell DMC increases in some cases. Due to such a decrease, the variation in the threshold voltage of the dummy memory cell DMC becomes larger than that before the erase operation in some cases. Therefore, that is, when the writing of data and the erase operation are repeatedly performed on the memory cell many times, as illustrated in FIG. 22, the variation in the threshold voltage of the dummy memory cell DMC increases.

[Effects]

In the erase operation in the semiconductor memory device according to the embodiment, from the loop "1" (FIG. 13) to the loop "2" (FIG. 13), the comparatively large voltage $V_{WLD1}$ is applied to the dummy word line WLD, and the voltage applied to the dummy memory cell DMC is comparatively lowered. Thus, until the end of the loop "2", as in Comparative Example 2, the variation of the threshold voltage of the dummy memory cell DMC and the decrease in the threshold voltage of the dummy memory cell DMC can be reduced.

In the erase operation in the semiconductor memory device according to the embodiment, when the erase verify operation is performed in the loop "2" and the result is FAIL, the voltage $V_{WLD2}$ lower than the voltage $V_{WLD1}$ is applied to the dummy word line WLD at and after the loop "3". Thus, as in Comparative Example 1, the increase in the number of the unerased memory cell $MC_{ND}$ can be reduced.

Additionally, in the erase operation in the semiconductor memory device according to the embodiment, the WLD program operation is performed in the loop "3". Thus, the excessive accumulation of the holes in the electric charge accumulating film 132 in the dummy memory cell DMC can be reduced, a phenomenon as described with reference to FIG. 22 can be reduced, and the variation of the threshold voltage of the dummy memory cell DMC can be reduced.

With this method, when the erase verify operation is performed in the loop "2" and the result is PASS, the WLD program operation is not performed in the erase operation. Accordingly, while the variation of the threshold voltage of the dummy memory cell DMC is reduced, a time period required for the erase operation can be comparatively short.

As described with reference to FIG. 10, one-bit data may be stored in the usual memory cell MC and the memory cell $MC_{ND}$ according to the first embodiment. Here, the number of executions of the write operation and the erase operation is many in the semiconductor memory device in which one-bit data are stored in the usual memory cell MC and the memory cell $MC_{ND}$, and the threshold voltages of the dummy memory cells DMC vary comparatively easily in some cases. The semiconductor memory device according to the first embodiment allows reducing the variation in the threshold voltages of the dummy memory cells DMC comparatively easily even in such a case.

As described with reference to FIG. 11B and FIG. 11C, the usual memory cell MC and memory cell $MC_{ND}$ according to the first embodiment may store data of a plurality of bits. Here, for example, as illustrated in FIG. 11A as an example, in the semiconductor memory device in which the usual memory cell MC and the memory cell $MC_{ND}$ store data of a plurality of bits, the threshold voltages of the usual memory cell MC and the memory cell $MC_{ND}$ are controlled in a comparatively wide voltage range in some cases. In this case, the phenomenon described with reference to FIG. 22 is likely to occur in some cases. The semiconductor memory device according to the first embodiment allows reducing the variation in the threshold voltages of the dummy memory cells DMC comparatively easily even in such a case.

Modification

Figure 23:
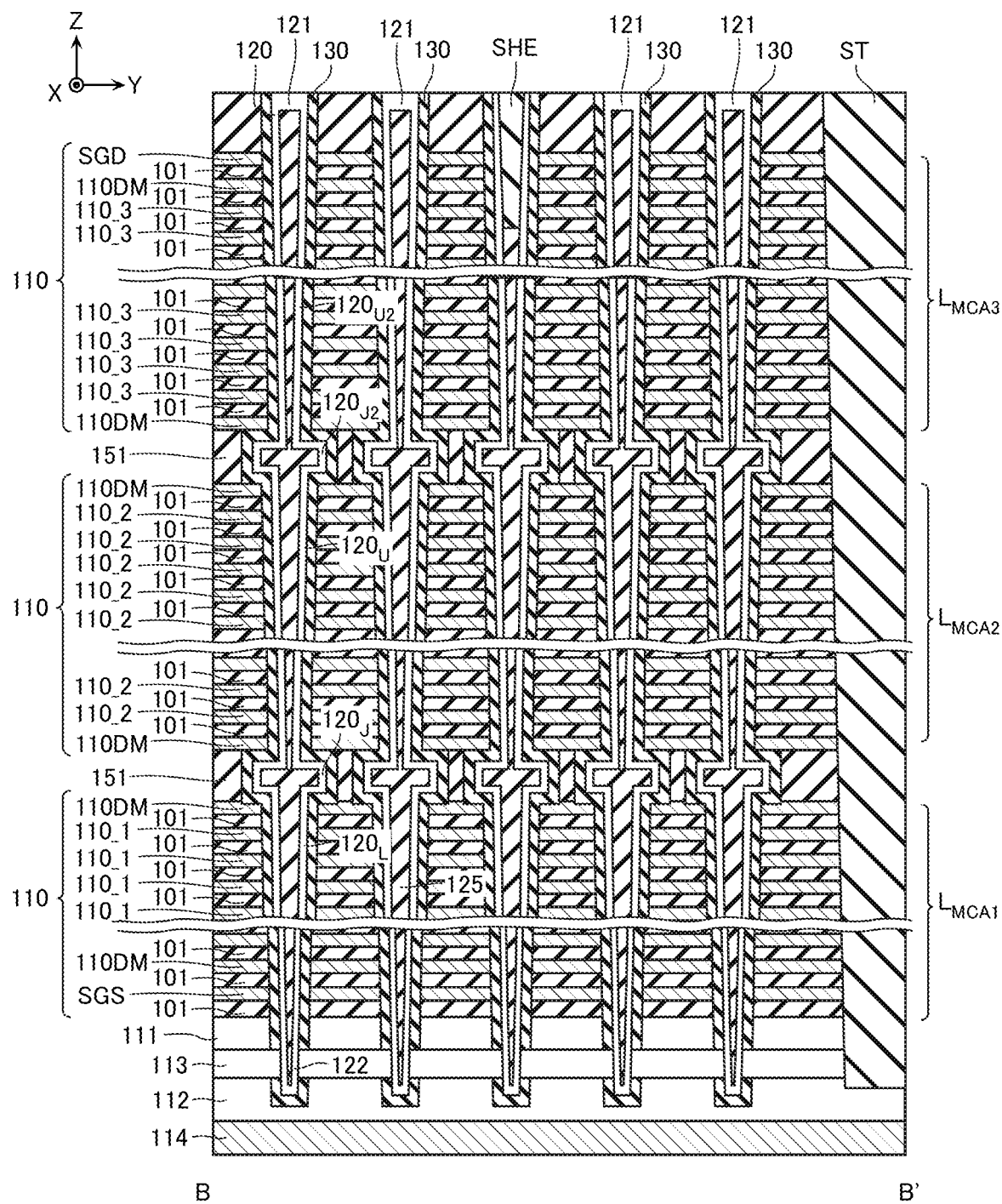
FIG. 23 is a schematic cross-sectional view illustrating a configuration of a part of a semiconductor memory device according to a modification.

Next, with reference to FIG. 23, the modification of semiconductor memory devices according to the first embodiment will be described. FIG. 23 is a schematic cross-sectional view illustrating a configuration of a part of the semiconductor memory device according to the modification.

As illustrated in FIG. 23, the memory cell array layer $L_{MCA}$ in the semiconductor memory device according to this modification includes the memory cell array layer $L_{MCA1}$, the memory cell array layer $L_{MCA2}$ disposed above the memory cell array layer $L_{MCA1}$, and a memory cell array layer $L_{MCA3}$ disposed above the memory cell array layer $L_{MCA2}$.

Among the plurality of conductive layers 110 disposed in the memory cell array layers $L_{MCA1}$, $L_{MCA2}$, $L_{MCA3}$, the conductive layers 110 that function as the gate electrodes of the usual word lines WL and the usual memory cells MC are referred to as a first gate electrode 110_1, a second gate electrode 110_2, and a third gate electrode 110_3, respectively.

In this modification, the conductive layer 110 that functions as the drain-side select gate line SGD or the like is disposed in the memory cell array layer $L_{MCA3}$, not the memory cell array layer $L_{MCA2}$.

As illustrated in FIG. 23, the semiconductor layer 120 according to this modification includes the semiconductor region $120_L$ included in the memory cell array layer $L_{MCA1}$, the semiconductor region $120_U$ included in the memory cell array layer $L_{MCA2}$, and a semiconductor region $120_{U2}$ included in the memory cell array layer $L_{MCA3}$. The semiconductor layer 120 includes the semiconductor region $120_J$ connected to the upper end of the semiconductor region $120_L$ and the lower end of the semiconductor region $120_U$, a semiconductor region $120_{J2}$ connected to the upper end of the semiconductor region $120_U$ and a lower end of the semiconductor region $120_{U2}$, the impurity region 122 connected to the lower end of the semiconductor region $120_L$, and the impurity region 121 connected to an upper end of the semiconductor region $120_{U2}$.

The semiconductor region $120_{U2}$ is an approximately cylindrical-shaped region extending in the Z-direction. Each of the semiconductor regions $120_{U2}$ has an outer peripheral surface surrounded by the plurality of conductive layers 110 included in the memory cell array layer $L_{MCA3}$ and is opposed to the plurality of conductive layers 110.

The semiconductor region $120_{J2}$ is disposed above the plurality of conductive layers 110 included in the memory cell array layer $L_{MCA2}$ and disposed below the plurality of conductive layers 110 included in the memory cell array layer $L_{MCA3}$.

[Dummy Conductive Layer 110DM]

One or plurality of dummy conductive layers 110DM may be disposed between the first gate electrode 110_1 and the source-side select gate line SGS. Additionally, one or plurality of dummy conductive layers 110DM may be disposed between the third gate electrode 110_3 and the drain-side select gate line SGD.

Among the plurality of conductive layers 110 disposed in the memory cell array layer $L_{MCA1}$, one or plurality of conductive layers 110 closest to the semiconductor region $120_J$ may be disposed as the dummy conductive layer 110DM.

Among the plurality of conductive layers 110 disposed in the memory cell array layer $L_{MCA2}$, one or plurality of conductive layers 110 closest to the semiconductor region 120$_J$ may be disposed as the dummy conductive layer 110DM.

Among the plurality of conductive layers 110 disposed in the memory cell array layer L$_{MCA2}$, one or plurality of conductive layers 110 closest to the semiconductor region 120$_{J2}$ may be disposed as the dummy conductive layer 110DM.

Among the plurality of conductive layers 110 disposed in the memory cell array layer L$_{MCA3}$, one or plurality of conductive layers 110 closest to the semiconductor region 120$_{J2}$ may be disposed as the dummy conductive layer 110DM.

That is, the dummy conductive layer 110DM may be disposed between the first gate electrode 110_1 and the second gate electrode 110_2. The dummy conductive layer 110DM may be disposed between the second gate electrode 110_2 and the third gate electrode 110_3.

Second Embodiment

Figure 24:
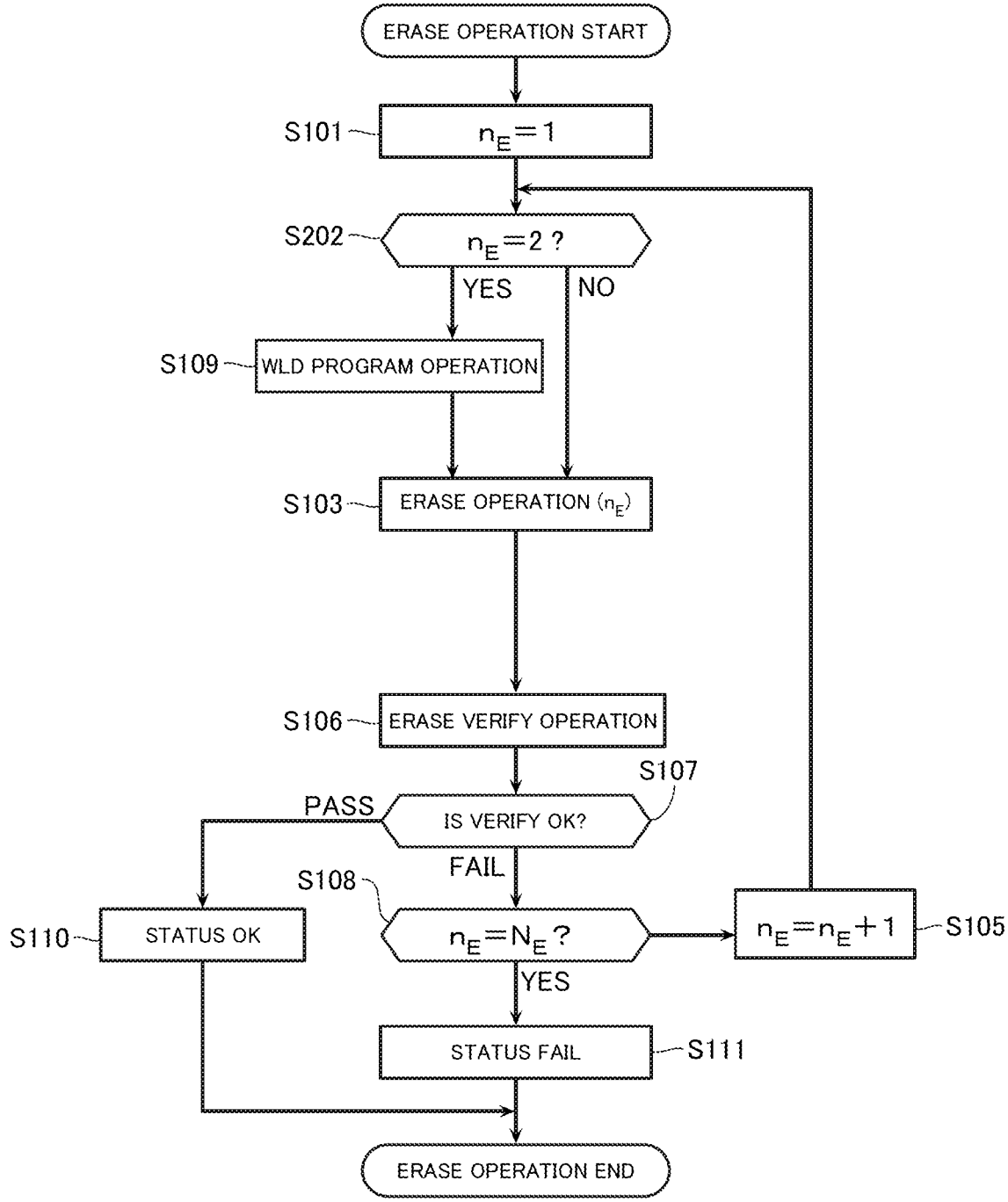
FIG. 24 is a flowchart for describing an erase operation of a semiconductor memory device according to a second embodiment.
Figure 25:
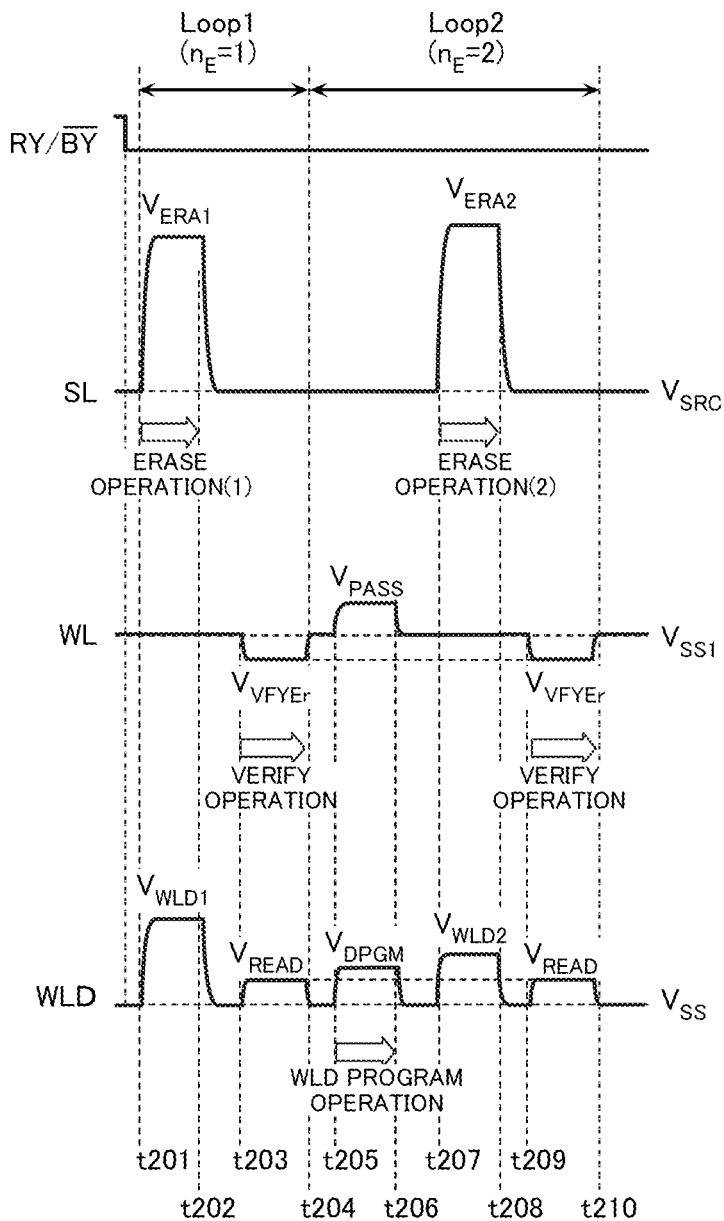
FIG. 25 is a timing chart for describing the erase operation of the semiconductor memory device.

Next, with reference to FIG. 24 and FIG. 25, a semiconductor memory device according to the second embodiment will be described. FIG. 24 is a flowchart for describing an erase operation according to the second embodiment. FIG. 25 is a flowchart for describing the erase operation according to the second embodiment. In the following description, the descriptions of the configurations and the operations similar to those of the first embodiment will be omitted in some cases.

The semiconductor memory device according to the embodiment is configured basically similarly to the semiconductor memory device according to the first embodiment. However, the semiconductor memory device according to the second embodiment differs from that of the first embodiment in a method of the erase operation.

[Steps of Erase Operation]

First, using FIG. 24, each of steps of the erase operation according to the second embodiment will be described.

At Step S101, Step S103, and Step S105 to Step S110, operations similar to the erase operation according to the first embodiment are performed. However, in the erase operation according to the second embodiment, Step S202 is performed instead of Step S102.

At Step S202, whether the loop count n$_E$ is a predetermined count "2" or not is determined. When the loop count n$_E$ is not the predetermined count "2", the process proceeds to Step S103. When the loop count n$_E$ is the predetermined count "2", after the process proceeds to Step S109, the process proceeds to Step S103.

In the example of FIG. 24, Step S104 (FIG. 12) is not performed. Therefore, in the example in FIG. 24, the verify operation is performed also in the loop "1".

[Erase Operation Loop]

Next, each loop in the erase operation will be described with reference to FIG. 25.

[Erase Operation: Loop "1"]

The case where the loop count n$_E$ is "1" will be described. In FIG. 25, the loop "1" of the erase operation is performed from timing t201 to timing t204.

When the loop count n$_E$ is "1", at Step S202 (FIG. 24), the process proceeds to Step S103.

At Step S103 (FIG. 24), the erase operation (1) similar to that of the first embodiment is performed from timing t201 to timing t202.

At Step S106 (FIG. 24), the erase verify operation similar to the first embodiment is performed from timing t203 to timing t204.

At Step S107 (FIG. 24), the result of the erase verify operation is determined. The case in which it is determined to be verify FAIL will be described below. At Step S108, the predetermined count N$_E$ is determined to be larger than "1" and the process proceeds to Step S105.

At Step S105, 1 is further added to the loop count n$_E$ such that the loop count becomes "2" and the process proceeds to Step S102.

[Erase Operation: Loop "2"]

Next, the case where the loop count n$_E$ is "2" will be described. In FIG. 25, the loop "2" of the erase operation is performed from timing t204 to timing t210.

When the loop count n$_E$ is "2", at Step S202 (FIG. 24), the process proceeds to Step S109.

At Step S109 (FIG. 24), the WLD program operation similar to that of the first embodiment is performed from timing t205 to timing t206.

At Step S103 (FIG. 24), the erase operation (2) is performed from timing t207 to timing t208. This erase operation (2) is performed basically similarly to the erase operation (2) according to the first embodiment. However, not the voltage V$_{WLD1}$ but the voltage V$_{WLD2}$ is applied to the dummy word line WLD.

At Step S106 (FIG. 24), the erase verify operation similar to that of the first embodiment is performed from timing t209 to timing t210.

Third Embodiment

Figure 26:
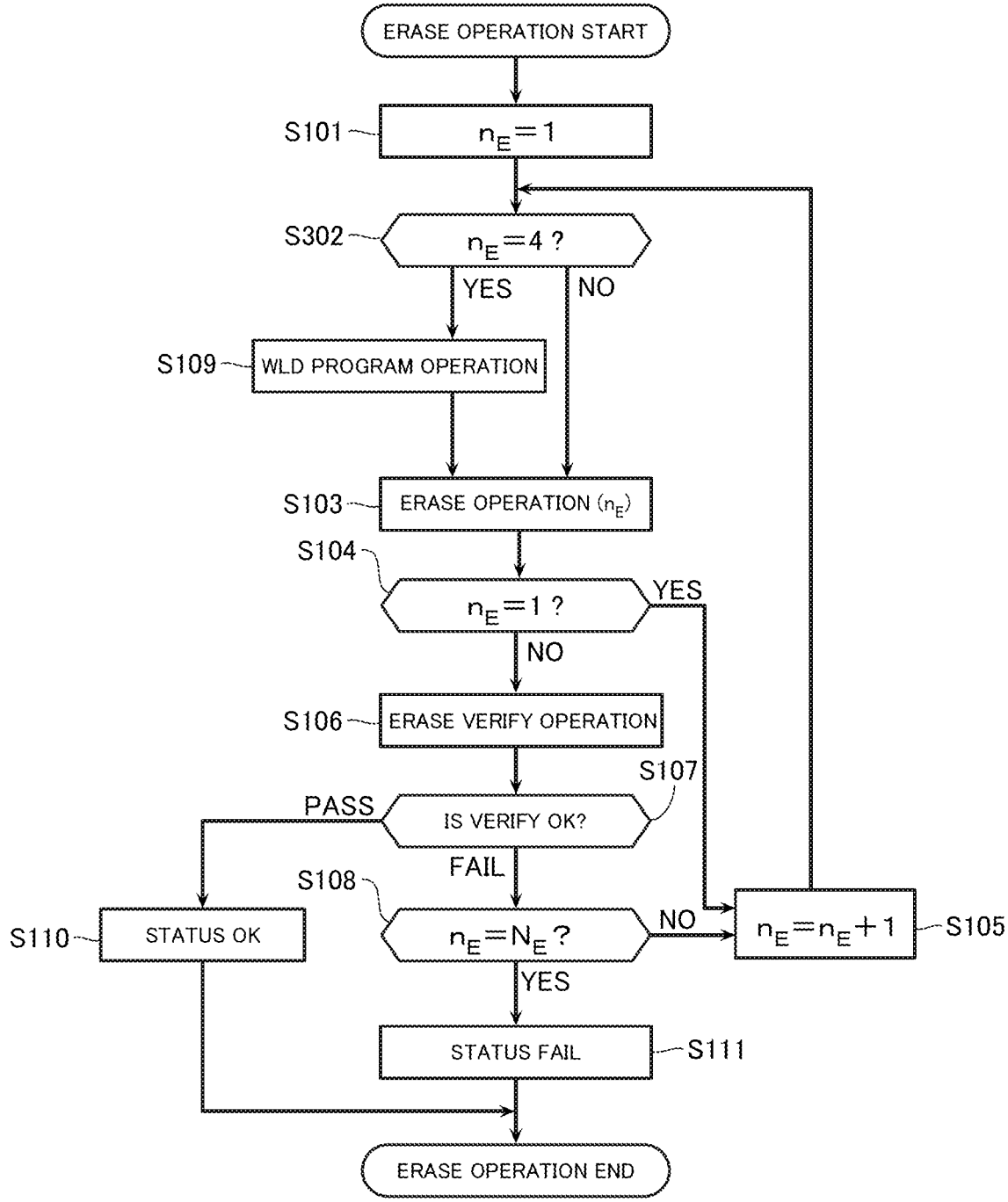
FIG. 26 is a flowchart for describing an erase operation of a semiconductor memory device according to a third embodiment.
Figure 27:
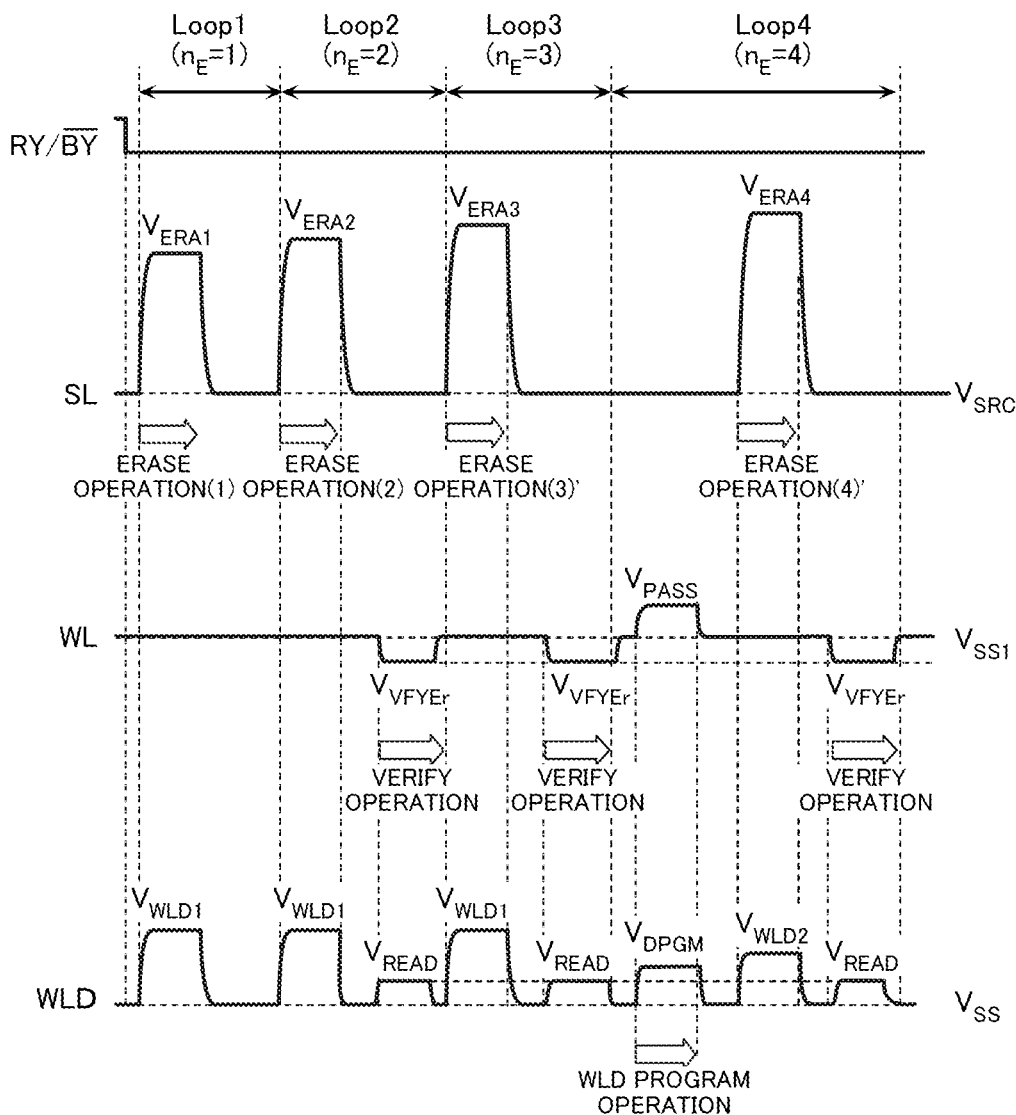
FIG. 27 is a timing chart for describing the erase operation of the semiconductor memory device.

Next, with reference to FIG. 26 and FIG. 27, a configuration of a semiconductor memory device according to the third embodiment will be described. FIG. 26 is a flowchart for describing the erase operation. FIG. 27 is a timing chart for describing the erase operation. In the following description, the descriptions of the configurations and the operations similar to those of the first embodiment will be omitted in some cases.

The semiconductor memory device according to the embodiment is configured basically similarly to the semiconductor memory device according to the first embodiment. However, the semiconductor memory device according to the third embodiment differs from that of the first embodiment in a method of the erase operation.

[Steps of Erase Operation]

First, using FIG. 26, each of steps of the erase operation according to the third embodiment will be described.

At Step S101 and Step S103 to Step S110, operations similar to the erase operation according to the first embodiment are performed. However, in the erase operation according to the third embodiment, Step S302 is performed instead of Step S102 (FIG. 12).

At Step S302, whether the loop count n$_E$ is a predetermined count "4" or not is determined. When the loop count n$_E$ is not the predetermined count "4", the process proceeds to Step S103. When the loop count n$_E$ is the predetermined count "4", after the process proceeds to Step S109, the process proceeds to Step S103.

[Erase Operation Loop]

Next, each loop in the erase operation will be described with reference to FIG. 27. In the loop "1" and the loop "2" of the erase operation according to the third embodiment, operations similar to the loop "1" and the loop "2" (FIG. 13) according to the first embodiment are performed.

In the loop "3" in the erase operation according to the third embodiment, the operations similar to the loop "2" in the erase operation are performed. However, in an erase operation (3)' in the loop "3" of the erase operation according to the third embodiment, the third erase voltage $V_{ERA3}$ is applied to the source line SL and the voltage $V_{WLD1}$ is applied to the dummy word line WLD.

In a loop "4" of the erase operation according to the third embodiment, the operations similar to the loop "3" (FIG. 13) of the erase operation in the first embodiment are performed. However, in an erase operation (4)' in the loop "4" of the erase operation according to the third embodiment, a fourth erase voltage $V_{ERA4}$ same as or larger than the third erase voltage $V_{ERA3}$ is applied to the source line SL.

[Others]

In the first embodiment, as depicted at Step S102 in FIG. 12, the example in which the WLD program operation at Step S109 is performed with the $n_E$ of "3" has been described. However, when the process proceeds to the loop at and after the loop "4", the WLD program operation similar to that of the loop "3" may be performed in the loop at and after the loop "4" or need not be performed.

In the second embodiment, as depicted at Step S202 in FIG. 24, the example in which the WLD program operation at Step S109 is performed with the $n_E$ of "2" has been described. However, when the process proceeds to the loop at and after the loop "3", the WLD program operation similar to that of the loop "3" may be performed in the loop at and after the loop "3" or need not be performed.

In the third embodiment, as depicted at Step S302 in FIG. 26, the example in which the WLD program operation at Step S109 is performed with the $n_E$ of "4" has been described. However, when the process proceeds to the loop at and after the loop "5", the WLD program operation similar to that of the loop "4" may be performed in the loop at and after the loop "5" or need not be performed.

The example in which when the erase operation ($n_E$) in the first to third embodiments is performed, as illustrated in FIG. 14 and FIG. 17, the voltage $V_{SG'}$ is applied to the drain-side select gate line SGD and the drain-side select transistor STD enters the OFF state has been described. However, in the erase operation ($n_E$), the voltage $V_{SG''}$ may be applied to the drain-side select gate line SGD to generate the GIDL in the drain-side select transistor STD. In this respect, the voltage $V_{SG''}$ or the voltage $V_{SG'}$ may be applied to the source-side select gate line SGS. In the erase verify operation in the first to third embodiments, the erase verify voltage $V_{VFYEr}$ may be a voltage larger than the first voltage $V_{SS1}$, not the voltage smaller than the first voltage $V_{SS1}$.

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate;
    a plurality of gate electrodes arranged in a first direction intersecting with a surface of the substrate;
    a semiconductor layer extending in the first direction and opposed to the plurality of gate electrodes;
    an electric charge accumulating layer disposed between the plurality of gate electrodes and the semiconductor layer;
    a conductive layer connected to one end portion in the first direction of the semiconductor layer; and
    a control circuit electrically connected to the plurality of gate electrodes and the conductive layer, wherein
    the plurality of gate electrodes include:
        a plurality of first gate electrodes;
        a plurality of second gate electrodes farther from the conductive layer than the plurality of first gate electrodes; and
        a third gate electrode disposed between the plurality of first gate electrodes and the plurality of second gate electrodes, and
    the control circuit is configured to be able to perform an erase operation, wherein
    the erase operation includes:
        at least one-time first operation that applies a first voltage to the conductive layer;
        a second operation performed after the at least one-time first operation, the second operation applying a second voltage to the third gate electrode; and
        at least one-time third operation performed after the second operation, the at least one-time third operation applying a third voltage same as or larger than the first voltage to the conductive layer.

2. The semiconductor memory device according to claim 1, wherein
    the control circuit:
        applies a fourth voltage smaller than the first voltage to the plurality of first gate electrodes and the plurality of second gate electrodes and applies a fifth voltage larger than the fourth voltage and smaller than the first voltage to the third gate electrode in the first operation;
        applies a sixth voltage larger than the fourth voltage and smaller than the second voltage to the plurality of first gate electrodes and the plurality of second gate electrodes in the second operation; and
        applies the fourth voltage to the plurality of first gate electrodes and the plurality of second gate electrodes and applies a seventh voltage larger than the fourth voltage and smaller than the fifth voltage to the third gate electrode in the third operation.

3. The semiconductor memory device according to claim 1, wherein
    the third gate electrode is a dummy electrode.

4. The semiconductor memory device according to claim 1, comprising
    a first terminal connected to the control circuit that outputs a ready signal or a busy signal of the semiconductor memory device, wherein
    an output of the first terminal changes from the ready signal to the busy signal before the first operation,
    the output of the first terminal maintains the busy signal from the first operation until an end of the third operation, and
    the output of the first terminal changes from the busy signal to the ready signal after the end of the third operation.

5. The semiconductor memory device according to claim 1, wherein
    the semiconductor layer includes:
        a first region extending in the first direction and opposed to the plurality of first gate electrodes; and a second region extending in the first direction and opposed to the plurality of second gate electrodes, wherein when:
an end portion on a substrate side in the first direction of the first region is assumed to be a first end portion;
an end portion on a side opposite to the substrate in the first direction of the first region is assumed to be a second end portion;
an end portion on the substrate side in the first direction of the second region is assumed to be a third end portion;
an end portion on a side opposite to the substrate in the first direction of the second region is assumed to be a fourth end portion;
a width in a second direction intersecting with the first direction of the first end portion is assumed to be a first width;
a width in the second direction of the second end portion is assumed to be a second width;
a width in the second direction of the third end portion is assumed to be a third width; and
a width in the second direction of the fourth end portion is assumed to be a fourth width, wherein
the second width and the fourth width differ from the first width and the third width, respectively.

6. The semiconductor memory device according to claim 5, wherein
the semiconductor layer includes a third region connected between the first region and the second region, and
when a width in the second direction of the third region is assumed to be a fifth width, the fifth width is larger than the second width and the third width.

7. The semiconductor memory device according to claim 5, wherein
the third gate electrode is disposed between the plurality of first gate electrodes and the second end portion.

8. The semiconductor memory device according to claim 5, wherein
the third gate electrode is disposed between the plurality of second gate electrodes and the third end portion.

9. A semiconductor memory device comprising:
a substrate;
a plurality of gate electrodes arranged in a first direction intersecting with a surface of the substrate;
a semiconductor layer extending in the first direction and opposed to the plurality of gate electrodes;
an electric charge accumulating layer disposed between the plurality of gate electrodes and the semiconductor layer;
a conductive layer connected to one end portion in the first direction of the semiconductor layer; and
a control circuit electrically connected to the plurality of gate electrodes and the conductive layer, wherein
the plurality of gate electrodes include:
a plurality of first gate electrodes;
a plurality of second gate electrodes farther from the conductive layer than the plurality of first gate electrodes; and
a third gate electrode disposed between the plurality of first gate electrodes and the plurality of second gate electrodes, and
the control circuit is configured to be able to perform an erase operation, wherein
the erase operation includes:
a first operation that applies a first voltage to the plurality of first gate electrodes and the plurality of second gate electrodes and applies a second voltage larger than the first voltage to the third gate electrode;
a second operation that applies a third voltage larger than the first voltage to the plurality of first gate electrodes and the plurality of second gate electrodes and applies a fourth voltage larger than the third voltage to the third gate electrode; and
a third operation that applies the first voltage to the plurality of first gate electrodes and the plurality of second gate electrodes and applies a fifth voltage larger than the first voltage and smaller than the second voltage to the third gate electrode.

10. The semiconductor memory device according to claim 9, wherein
the third gate electrode is a dummy electrode.

11. The semiconductor memory device according to claim 9, comprising
a first terminal connected to the control circuit that outputs a ready signal or a busy signal of the semiconductor memory device, wherein
an output of the first terminal changes from the ready signal to the busy signal before the first operation,
the output of the first terminal maintains the busy signal from the first operation until an end of the third operation, and
the output of the first terminal changes from the busy signal to the ready signal after the end of the third operation.

12. The semiconductor memory device according to claim 9, wherein
the semiconductor layer includes:
a first region extending in the first direction and opposed to the plurality of first gate electrodes; and
a second region extending in the first direction and opposed to the plurality of second gate electrodes, wherein
when:
an end portion on a substrate side in the first direction of the first region is assumed to be a first end portion;
an end portion on a side opposite to the substrate in the first direction of the first region is assumed to be a second end portion;
an end portion on the substrate side in the first direction of the second region is assumed to be a third end portion;
an end portion on a side opposite to the substrate in the first direction of the second region is assumed to be a fourth end portion;
a width in a second direction intersecting with the first direction of the first end portion is assumed to be a first width;
a width in the second direction of the second end portion is assumed to be a second width;
a width in the second direction of the third end portion is assumed to be a third width; and
a width in the second direction of the fourth end portion is assumed to be a fourth width, wherein
the second width and the fourth width differ from the first width and the third width, respectively.

13. The semiconductor memory device according to claim 12, wherein
the semiconductor layer includes a third region connected between the first region and the second region, and
when a width in the second direction of the third region is assumed to be a fifth width, the fifth width is larger than the second width and the third width.

14. The semiconductor memory device according to claim 12, wherein
the third gate electrode is disposed between the plurality of first gate electrodes and the second end portion.

15. The semiconductor memory device according to claim 12, wherein
the third gate electrode is disposed between the plurality of second gate electrodes and the third end portion.

16. A semiconductor memory device comprising:
a memory string that extends in a first direction and includes a select transistor, a dummy cell, and a plurality of memory cells;
a select gate electrode connected to the select transistor;
a dummy gate electrode connected to the dummy cell;
a plurality of gate electrodes connected to the plurality of memory cells;
a conductive layer connected to one end portion of the memory string; and
a control circuit connected to the select gate electrode, the plurality of gate electrodes, the dummy gate electrode, and the conductive layer, the control circuit configured to execute an erase operation of the plurality of memory cells, wherein
the erase operation includes:
a first operation that applies a first voltage to the plurality of gate electrodes and applies a second voltage larger than the first voltage to the dummy gate electrode;
a second operation performed after the first operation, the second operation applying a third voltage larger than the first voltage to the plurality of gate electrodes and applying a fourth voltage larger than the third voltage to the dummy gate electrode; and
a third operation performed after the second operation, the third operation applying a fifth voltage smaller than the second voltage to the plurality of first gate electrodes and applying a sixth voltage larger than the fifth voltage and smaller than the second voltage to the dummy gate electrode.

17. The semiconductor memory device according to claim 16, wherein
in the first operation, a seventh voltage larger than the second voltage is applied to the conductive layer, and
in the third operation, an eighth voltage same as or larger than the seventh voltage is applied to the conductive layer.

18. The semiconductor memory device according to claim 16, wherein
the control circuit does not store user data in the dummy cell.

19. The semiconductor memory device according to claim 16, wherein
a fourth operation is performed after the first operation and before the second operation, and the fourth operation applies a ninth voltage smaller than the third voltage to the plurality of gate electrodes and applies a tenth voltage smaller than the fourth voltage and larger than the ninth voltage to the dummy gate electrode.

* * * * *